(12) United States Patent
Ward et al.

(10) Patent No.: US 10,368,181 B2
(45) Date of Patent: Jul. 30, 2019

(54) LOUDNESS ADJUSTMENT FOR DOWNMIXED AUDIO CONTENT

(71) Applicants: Dolby Laboratories Licensing Corporation, San Francisco, CA (US); Dolby International AB, Amsterdam Zuidoost (NL)

(72) Inventors: Michael Ward, Orinda, CA (US); Jeffrey Riedmiller, Novato, CA (US); Scott Gregory Norcross, San Rafael, CA (US); Alexander Stahlmann, Bubenreuth (DE)

(73) Assignees: Dolby Laboratories Licensing Corporation, San Francisco, CA (US); Dolby International AB, Amsterdam Zuidoost (NL)

( * ) Notice: Subject to any disclaimer, the term of this patent is extended or adjusted under 35 U.S.C. 154(b) by 0 days.

(21) Appl. No.: 16/115,292

(22) Filed: Aug. 28, 2018

(65) Prior Publication Data

US 2019/0028827 A1    Jan. 24, 2019

Related U.S. Application Data

(63) Continuation of application No. 15/625,749, filed on Jun. 16, 2017, now Pat. No. 10,070,243, which is a
(Continued)

(51) Int. Cl.
*H04S 7/00* (2006.01)
*G10L 19/008* (2013.01)
(Continued)

(52) U.S. Cl.
CPC .............. *H04S 7/30* (2013.01); *G10L 19/008* (2013.01); *G10L 21/0324* (2013.01);
(Continued)

(58) Field of Classification Search
CPC ... G10L 19/008; G10L 21/0324; H04S 1/007; H04S 7/30; H04S 1/002; H04S 2400/13; H04S 2400/03
(Continued)

(56) References Cited

U.S. PATENT DOCUMENTS 7,072,477 B1    7/2006  Kincaid
7,369,906 B2    5/2008  Frindle
(Continued)

FOREIGN PATENT DOCUMENTS

CN    1520069    8/2004
CN    1886780    12/2006
(Continued)

OTHER PUBLICATIONS

Hatanaka et al. ( "Proposed Update to the family of AAC LC Based Profiles" MPEG Meeting, ISO/IEC JTC1/SC29/WG11, Jul. 11, 2012, Stockholm, Sweden, pp. 1-20).*
(Continued)

*Primary Examiner* — Paul Kim

(57) ABSTRACT

Audio content coded for a reference speaker configuration is downmixed to downmix audio content coded for a specific speaker configuration. One or more gain adjustments are performed on individual portions of the downmix audio content coded for the specific speaker configuration. Loudness measurements are then performed on the individual portions of the downmix audio content. An audio signal that comprises the audio content coded for the reference speaker configuration and downmix loudness metadata is generated. The downmix loudness metadata is created based at least in part on the loudness measurements on the individual portions of the downmix audio content.

3 Claims, 12 Drawing Sheets

Related U.S. Application Data continuation of application No. 15/091,366, filed on Apr. 5, 2016, now Pat. No. 9,686,624, which is a continuation of application No. 14/916,522, filed as application No. PCT/US2014/054718 on Sep. 9, 2014, now Pat. No. 9,521,501.

(60) Provisional application No. 61/938,043, filed on Feb. 10, 2014, provisional application No. 61/892,313, filed on Oct. 17, 2013, provisional application No. 61/891,324, filed on Oct. 15, 2013, provisional application No. 61/877,230, filed on Sep. 12, 2013.

(51) Int. Cl.
*G10L 21/0324* (2013.01)
*H04S 1/00* (2006.01)

(52) U.S. Cl.
CPC .............. *H04S 1/002* (2013.01); *H04S 1/007* (2013.01); *H04S 2400/03* (2013.01); *H04S 2400/13* (2013.01)

(58) Field of Classification Search
USPC ...................................................... 381/23, 22
See application file for complete search history.

(56) References Cited

U.S. PATENT DOCUMENTS

| | | |
|---|---|---|
| 7,729,673 B2 | 6/2010 | Romesburg |
| 8,315,396 B2 | 11/2012 | Schreiner |
| 8,781,820 B2 | 7/2014 | Seguin |
| 8,903,098 B2 | 12/2014 | Tsuji |
| 8,965,774 B2 | 2/2015 | Eppolito |
| 8,989,884 B2 | 3/2015 | Guetta |
| 9,240,763 B2 | 1/2016 | Baumgarte |
| 9,294,062 B2 | 3/2016 | Hatanaka |
| 9,300,268 B2 | 3/2016 | Chen |
| 9,542,952 B2 | 1/2017 | Hatanaka |
| 9,576,585 B2 | 2/2017 | Bleidt |
| 9,608,588 B2 | 3/2017 | Baumgarte |
| 9,633,663 B2 | 4/2017 | Heuberger |
| 9,830,915 B2 | 11/2017 | Schreiner |
| 9,836,272 B2 | 12/2017 | Kono |
| 2008/0025530 A1 | 1/2008 | Romesburg |
| 2008/0267184 A1 | 10/2008 | Arisoylu |
| 2010/0076772 A1 | 3/2010 | Kim |
| 2010/0135507 A1 | 6/2010 | Kino |
| 2012/0275625 A1 | 11/2012 | Kono |
| 2013/0054251 A1 | 2/2013 | Eppolito |
| 2013/0094669 A1 | 4/2013 | Kono |
| 2016/0225376 A1 | 8/2016 | Honma |
| 2016/0315722 A1 | 10/2016 | Holman |
| 2016/0351202 A1 | 12/2016 | Baumgarte |
| 2017/0092280 A1 | 3/2017 | Hirabayashi |
| 2017/0223429 A1 | 8/2017 | Schreiner |

FOREIGN PATENT DOCUMENTS

| | | |
|---|---|---|
| CN | 101542596 | 9/2009 |
| CN | 101903944 | 12/2010 |
| CN | 102171755 | 8/2011 |
| CN | 102792588 | 11/2012 |
| CN | 105556837 | 5/2016 |
| EP | 3089161 | 11/2016 |
| JP | 2010-537233 | 12/2010 |
| JP | 2012-034295 | 2/2012 |
| JP | 2012-525600 | 10/2012 |
| WO | 2011/100155 | 8/2011 |
| WO | 2011/110525 | 9/2011 |
| WO | 2011/131732 | 10/2011 |
| WO | 2014/111290 | 7/2014 |
| WO | 2014/160849 | 10/2014 |
| WO | 2014/160895 | 10/2014 |
| WO | 2015/059087 | 4/2015 |
| WO | 2015/088697 | 6/2015 |
| WO | 2015/144587 | 10/2015 |
| WO | 2015/148046 | 10/2015 |
| WO | 2016/075053 | 5/2016 |
| WO | 2016/193033 | 12/2016 |
| WO | 2016/202682 | 12/2016 |
| WO | 2017/023423 | 2/2017 |
| WO | 2017/023601 | 2/2017 |
| WO | 2017/058731 | 4/2017 |
| WO | 2016/002738 | 5/2017 |

OTHER PUBLICATIONS

"A Guide to Dolby Metadata" Jan. 1, 2005, pp. 1-28 (available at http://www.dolby.com/us/en/technologies/a-guide-to-dolby-metadata.pdf).

"Practical Guidelines for Production and Implementation in Accordance with EBU R 128" Mar. 4, 2011, p. 26-39 http://www.irt.de/fileadmin/media/downloads/Produktion/Lautstaerkeproblematik/tech3343.pdf.

107th MPEG San Jose (CA), USA, Jan. 13-17, 2014, Meeting Report Panos Kudumakis qMedia, Queen Mary University of London https://code.soundsoftware.ac.uk/attachments/download/1094/1PanosSanJose107MPEGMeetingReport.pdf (visited Mar. 18, 2018).

108th MPEG Valencia, Spain, Mar. 31-Apr. 4, 2014, Meeting Report Panos Kudumakis qMedia, Queen Mary University of London https://code.soundsoftware.ac.uk/attachments/download/1119/1PanosValencia108MPEGMeetingReport.pdf (visited Mar. 18, 2018).

Norcross, S. et al "The Effect of Downmixing on Measured Loudness" AES presented at the 131st Convention, Oct. 20-23, 2011, New York, USA, pp. 1-4.

Rettelbach, N. "Proposed Update to the family of AAC LC Based Profiles" MPEG Meeting, ISO/IEC JTC1/SC29/WG11, Jul. 11, 2012, Stockholm, Sweden, pp. 1-20.

Sasaki, Y. et al "A Nested Infinite Gaussian Mixture Model for Identifying Known and Unknown Audio Events" IEEE, Dec. 31, 2013, pp. 1-4.

Neuendorf, M. et al "MPEG Unified Speech and Audio Coding—The ISO/MPEG Standard for High-Efficiency Audio Ooding of all Content Types" AES, presented at the 132nd Convention, Budapest, Hungary, Apr. 26-29, 2012, pp. 1-22.

Guy, J. et al "Mixed-Signal Audio Subsystem Enables High-Performance Audio in Portable Electronics" Dec. 2010, China Academic Journal Electronic Publishing House, pp. 1-3.

Jiwei, Wu "Design and Implementation of the Dual-Channel Mixing Audio System" Electronic Sci. & Tech. Jul. 15, 2013, China Academic Journal Electronic Publishing House, pp. 1-4.

* cited by examiner

```
┌─────────────────────────────────────────┐
│ receive an audio signal that comprises audio │
│ content and definition data for dynamic range │
│      compression curves 602             │
└─────────────────────────────────────────┘
                    │
┌─────────────────────────────────────────┐
│ determine a specific playback environment 604 │
└─────────────────────────────────────────┘
                    │
┌─────────────────────────────────────────┐
│       establish a specific dynamic range      │
│  Compression curve for the specific playback  │
│   environment based on the definition data for │
│     the dynamic range compression curves      │
│      extracted from the audio signal 606      │
└─────────────────────────────────────────┘
                    │
┌─────────────────────────────────────────┐
│  perform dynamic range control operations on  │
│   portions of the audio content extracted from │
│           the audio signal 608           │
└─────────────────────────────────────────┘
```

FIG. 6A

LOUDNESS ADJUSTMENT FOR DOWNMIXED AUDIO CONTENT

CROSS REFERENCE TO RELATED APPLICATIONS

This application is continuation of U.S. patent application Ser. No. 15/625,749, filed Jun. 16, 2017, which is continuation of U.S. patent application Ser. No. 15/091,366, filed Apr. 5, 2016, now U.S. Pat. No. 9,686,624, which is continuation of Ser. No. 14/916,522, filed Mar. 3, 2016, now U.S. Pat. No. 9,521,501, which is U.S. National Stage Entry of International Application No. PCT/US2014/054718, filed Sep. 9, 2014, which claims priority to U.S. Provisional Application Nos. 61/938,043, filed Feb. 10, 2014, 61/892,313, filed Oct. 17, 2013, 61/891,324, filed Oct. 15, 2013 and 61/877,230, filed Sep. 12, 2013, which are incorporated by their entirety herein.

TECHNOLOGY

The present invention pertains generally to processing audio signals and pertains more specifically to techniques that may be used to applying dynamic range control and other types of audio processing operations to audio signals in any of a wide variety of playback environments.

BACKGROUND

The increasing popularity of media consumer devices has created new opportunities and challenges for the creators and distributors of media content for playback on those devices, as well as for the designers and manufacturers of the devices. Many consumer devices are capable of playing back a broad range of media content types and formats including those often associated with high-quality, wide bandwidth and wide dynamic range audio content for HDTV, Blu-ray or DVD. Media processing devices may be used to play back this type of audio content either on their own internal acoustic transducers or on external transducers such as headphones; however, they generally cannot reproduce this content with consistent loudness and intelligibility across varying media format and content types.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF DRAWINGS

The present invention is illustrated by way of example, and not by way of limitation, in the figures of the accompanying drawings and in which like reference numerals refer to similar elements and in which:

FIG. 6A through FIG. 6D illustrate example process flows; and

DESCRIPTION OF EXAMPLE EMBODIMENTS

Figure 1A:
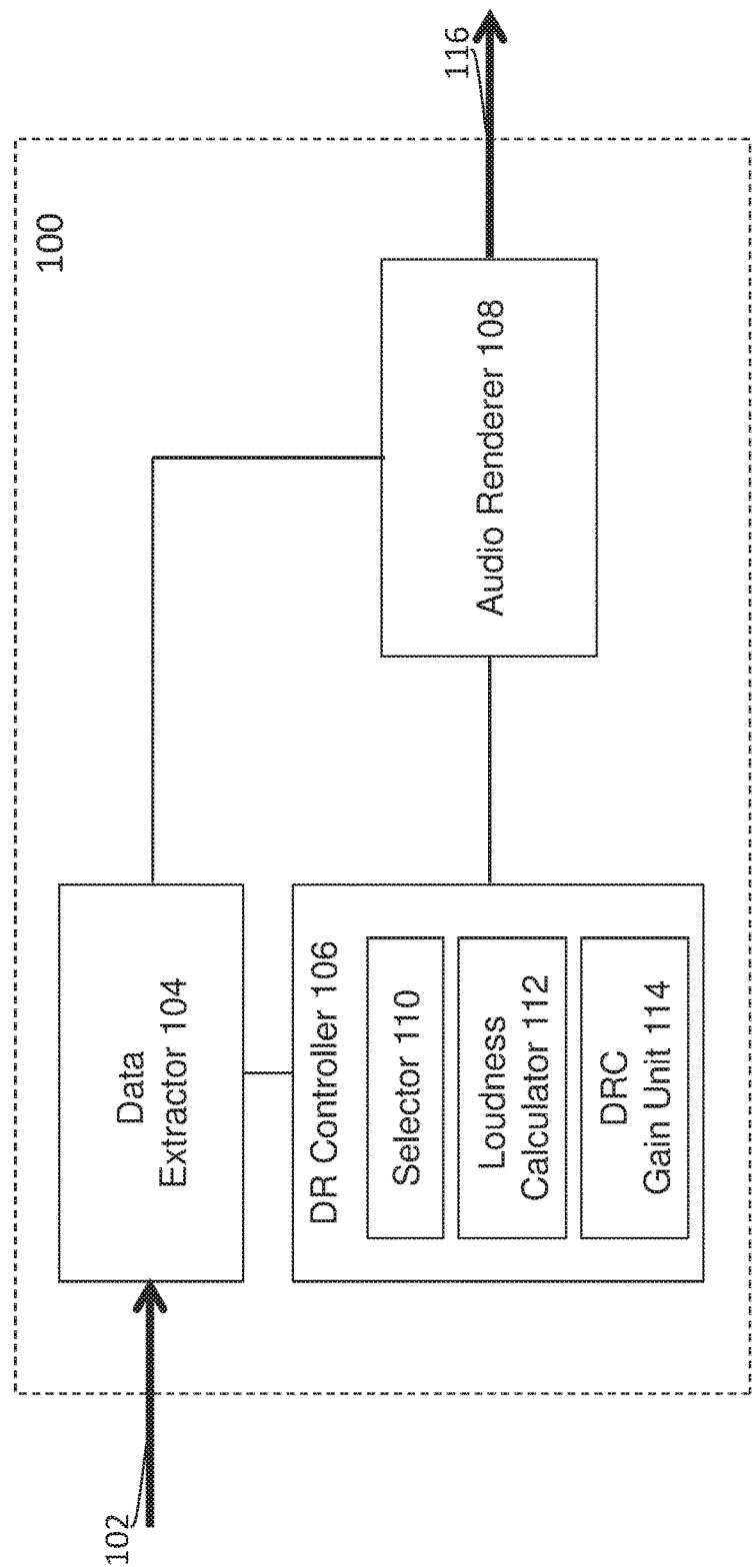
FIG. 1A and FIG. 1B illustrate an example audio decoder and an example audio encoder, respectively.

Example embodiments, which relate to applying dynamic range control and other types of audio processing operations to audio signals in any of a wide variety of playback environments, are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Example embodiments are described herein according to the following outline:
 1. GENERAL OVERVIEW
 2. DYNAMIC RANGE CONTROL
 3. AUDIO DECODER
 4. AUDIO ENCODER
 5. DYNAMIC RANGE COMPRESSION CURVES
 6. DRC GAINS, GAIN LIMITING AND GAIN SMOOTHING
 7. INPUT SMOOTHING AND GAIN SMOOTHING
 8. DRC OVER MULTIPLE FREQUENCY BANDS
 9. VOLUME ADJUSTMENT IN LOUDNESS DOMAIN
 10. DOWNMIX LOUDNESS ADJUSTMENT
 11. ADDITIONAL OPERATIONS RELATED TO GAINS
 12. SPECIFIC AND BROADBAND (OR WIDEBAND) LOUDNESS LEVELS
 13. INDIVIDUAL GAINS FOR INDIVIDUAL SUBSETS OF CHANNELS
 14. AUDITORY SCENE ANALYSIS
 15. LOUDNESS LEVEL TRANSITIONS
 16. RESET
 17. ENCODER-PROVIDED GAINS
 18. EXAMPLE SYSTEM AND PROCESS FLOWS
 19. IMPLEMENTATION MECHANISMS HARDWARE OVERVIEW
 20. EQUIVALENTS, EXTENSIONS, ALTERNATIVES AND MISCELLANEOUS 1. General Overview This overview presents a basic description of some aspects of an embodiment of the present invention. It should be noted that this overview is not an extensive or exhaustive summary of aspects of the embodiment. Moreover, it should be noted that this overview is not intended to be understood as identifying any particularly significant aspects or elements of the embodiment, nor as delineating any scope of the embodiment in particular, nor the invention in general. This overview merely presents some concepts that relate to the example embodiment in a condensed and simplified format, and should be understood as merely a conceptual prelude to a more detailed description of example embodiments that follows below. Note that, although separate embodiments are discussed herein, any combination of embodiments and/or partial embodiments discussed herein may be combined to form further embodiments.

In some approaches, an encoder assumes that audio content is being encoded for a particular environment for the purpose of dynamic range control, and determines audio processing parameters such as gains for dynamic range control, etc., for the particular environment. The gains determined by the encoder under these approaches typically have been smoothed with some time constants (e.g., in an exponential decay function, etc.), over some time intervals, etc. In addition, the gains determined by the encoder under these approaches may have been incorporated for gain limiting which ensure loudness levels to be no more than the clipping level for the assumed environment. Accordingly, the gains encoded with audio information into an audio signal by the encoder under these approaches are results of many different influences and irreversible. A decoder receiving the gains under these approaches would not be able to distinguish which part of the gains are for dynamic range control, which part of the gains are for gain smoothing, which part of the gains are for gain limiting, etc.

Under techniques as described herein, an audio encoder does not assume that only a specific playback environment at audio decoders needs to be supported. In an embodiment, the audio encoder transmits an encoded audio signal with audio content from which correct loudness levels (e.g., without clipping, etc.) can be determined. The audio encoder also transmits one or more dynamic range compression curves to the audio decoders. Any of the one or more dynamic range compression curves may be standard-based, proprietary, customized, content-provider-specific, etc. Reference loudness levels, attack times, release times, etc., may be transmitted by the audio encoder as a part of, or in conjunction with, the one or more dynamic range compression curves. Any of the reference loudness levels, attack times, release times, etc., may be standard-based, proprietary, customized, content-provider-specific, etc.

In some embodiments, the audio encoder implements auditory scene analysis (ASA) techniques, and uses the ASA techniques to detect auditory events in the audio content, and transmits one or more ASA parameters that describe the detected auditory events to the audio decoders.

In some embodiments, the audio encoder can also be configured to detect reset events in the audio content, and transmit indications of the reset events in a time-synchronous manner with the audio content to a downstream device such as an audio decoder, etc.

In some embodiments, the audio encoder can be configured to compute one or more sets of gains (e.g., DRC gains, etc.) for individual portions (e.g., audio data blocks, audio data frames, etc.) of the audio content and encode the sets of gains with the individual portions of the audio content into the encoded audio signal. In some embodiments, the sets of gains generated by the audio encoder correspond to one or more different gain profiles. In some embodiments, Huffman coding, differential coding, etc., may be used to code the sets of gains into, or read the sets of gains from, components, subdivisions, etc., of audio data frames. These components, subdivision, etc., may be referred to as sub-frames in the audio data frames. Different sets of gains may correspond to different sets of sub-frames. Each set of gains, or each set of sub-frames, may comprise two or more temporal components (e.g., sub-frames, etc.). In some embodiments, a bitstream formatter in an audio encoder as described herein may write, with one or more for-loops, one or more sets of gains together as differential data codes into one or more sets of sub-frames in audio data frames; correspondingly, a bitstream parser in an audio decoder as described herein may read any of the one or more sets of gains coded as the differential data codes from the one or more sets of sub-frames in the audio data frames.

In some embodiments, the audio encoder determines dialogue loudness levels in audio content that is to be encoded into the encoded audio signal, and transmits the dialogue loudness levels with the audio content to the audio decoders.

In some embodiments, the audio content is encoded in the encoded audio signal for a reference speaker configuration (e.g. a surround sound configuration, a 5.1 speaker configuration, etc.) that comprises more audio channels or speakers than those (e.g., a two channel headset configuration, etc.) with which a large number of audio decoders (e.g., mobile phones, tablet computers, etc.) operate. Loudness levels as measured in the reference speaker configuration for individual portions of the audio content may be different from loudness levels as measured in the specific speaker configuration such as a two-channel configuration, etc., for the same individual portions of the audio content, even if the same gain adjustments are made in both speaker configurations.

In some embodiments, an audio encoder as described herein is configured to provide downmix related metadata (e.g., comprising one or more downmix loudness parameters, etc.) to downstream audio decoders. The downmix related metadata from the audio encoder (150) can be used by a downstream audio decoder to efficiently and consistently perform (e.g., in real time, in near real time, etc.) additional downmix related gain adjustment operations for the purpose of producing relatively accurate target loudness levels in a downmix sound output. The additional downmix related gain adjustment operations may be used by the downstream audio decoder to prevent inconsistencies in measured loudness levels between the reference speaker configuration and the decoder's specific speaker configuration.

Techniques as described herein do not require audio decoders to be locked in with (e.g., irreversible, etc.) audio processing which may have been performed by an upstream device such as an audio encoder, etc., while assuming a hypothetic playback environment, scenario, etc., at a hypothetic audio decoder. The decoder as described herein may be configured to customize the audio processing operations based on a specific playback scenario, for example, in order to differentiate different loudness levels existing in audio content, minimize loss of audio perceptual quality at or near boundary loudness levels (e.g., minimum or maximum loudness levels, etc.), maintain spatial balance among channels or subsets of channels, etc.

An audio decoder that receives the encoded audio signal with the dynamic range compression curves, reference loudness levels, attack times, release times, etc., can determine a specific playback environment that is in use at the decoder, and select a specific compression curve with a corresponding reference loudness level corresponding to the specific playback environment.

The decoder can compute/determine loudness levels in individual portions (e.g., audio data blocks, audio data frames, etc.) of the audio content extracted from the encoded audio signal, or obtain the loudness levels in the individual portions of the audio content if the audio encoder has computed and provided the loudness levels in the encoded audio signal. Based on one or more of the loudness levels in the individual portions of the audio content, loudness levels in previous portions of the audio content, loudness levels in subsequent portions of the audio content if available, the specific compression curve, a specific profile related to the specific playback environment or scenario, etc., the decoder determines audio processing parameters such as gains for dynamic range control (or DRC gains), attack times, release times, etc. The audio processing parameters also can include adjustments for aligning dialogue loudness levels to a specific reference loudness level (which may be user adjustable) for the specific playback environment.

The decoder applies audio processing operations including (e.g., multi-channel, multi-band, etc.) dynamic range control, dialogue level adjustments, etc., with the audio processing parameters. The audio processing operations performed by the decoder may further include but are not limited to only: gain smoothing based on the attack and release times provided as a part of, or in conjunction with, the selected dynamic range compression curve, gain limiting for preventing clipping, etc. Different audio processing operations may be performed with different (e.g., adjustable, threshold-dependent, controllable, etc.) time constants. For example, gain limiting for preventing clipping may be applied to individual audio data blocks, individual audio data frames, etc., with relatively short time constants (e.g., instantaneous, approximately 5.3 milliseconds, etc.).

In some embodiments, the decoder can be configured to extract ASA parameters (e.g., temporal locations of auditory event boundaries, time-dependent values of an event certainty measure, etc.) from metadata in an encoded audio signal, and control the speed of gain smoothing in auditory events based on the extracted ASA parameters (e.g., use short time constants for attacks at auditory events boundaries, use long time constants to slow down gain smoothing within an auditory event, etc.).

In some embodiments, the decoder also maintains a histogram of instantaneous loudness levels for a certain time interval or window, and uses the histogram to control the speed of gain changes in loudness level transitions between programs, between a program and a commercial, etc., for example, by modifying the time constants.

In some embodiments, the decoder supports more than one speaker configuration (e.g., portable mode with speakers, portable mode with headphones, stereo mode, multi-channel mode, etc.). The decoder may be configured to maintain the same loudness levels between two different speaker configurations (e.g., between a stereo mode and a multi-channel mode, etc.), for example, when playing back the same audio content. The audio decoder may use one or more downmix equations to downmix multi-channel audio content, as received from an encoded audio signal for a reference speaker configuration for which the multi-channel audio content was coded to a specific speaker configuration at the audio decoder.

In some embodiments, automatic gain control (AGC) may be disabled in an audio decoder as described herein.

In some embodiments, mechanisms as described herein form a part of a media processing system, including but not limited to: an audiovisual device, a flat panel TV, a handheld device, game machine, television, home theater system, tablet, mobile device, laptop computer, netbook computer, cellular radiotelephone, electronic book reader, point of sale terminal, desktop computer, computer workstation, computer kiosk, various other kinds of terminals and media processing units, etc.

Various modifications to the preferred embodiments and the generic principles and features described herein will be readily apparent to those skilled in the art. Thus, the disclosure is not intended to be limited to the embodiments shown, but is to be accorded the widest scope consistent with the principles and features described herein.

2. Dynamic Range Control

Without customized dynamic range control, input audio information (e.g., PCM samples, time-frequency samples in a QMF matrix, etc.) is often reproduced at a playback device at loudness levels that are inappropriate for the playback device's specific playback environment (that is, including the device's physical and/or mechanical playback limitations), as the playback device's specific playback environment might be different from a target playback environment for which the encoded audio content had been coded at an encoding device.

Techniques as described herein can be used to support dynamic range control of a wide variety of audio content customized to any of a wide variety of playback environments while maintaining perceptual qualities of the audio content.

Dynamic Range Control (DRC) refers to time-dependent audio processing operations that alter (e.g., compress, cut, expand, boost, etc.) an input dynamic range of loudness levels in audio content into an output dynamic range that is different from the input dynamic range. For example, in a dynamic range control scenario, soft sounds may be mapped (e.g., boosted, etc.) to higher loudness levels and loud sounds may be mapped (e.g., cut, etc.) to lower loudness values. As a result, in a loudness domain, an output range of loudness levels becomes smaller than the input range of loudness levels in this example. In some embodiments, the dynamic range control, however, may be reversible so that the original range is restored. For example, an expansion operation may be performed to recover the original range so long as mapped loudness levels in the output dynamic range, as mapped from original loudness levels, are at or below a clipping level, each unique original loudness level is mapped to a unique output loudness level, etc.

DRC techniques as described herein can be used to provide a better listening experience in certain playback environments or situations. For example, soft sounds in a noisy environment may be masked by the noise that renders the soft sounds inaudible. Conversely, loud sounds may not be desired in some situations, for example, bothering neighbors. Many devices, typically with small form-factor loudspeakers, cannot reproduce sound at high output levels. In some cases, the lower signal levels may be reproduced below the human hearing threshold. The DRC techniques may perform mapping of input loudness levels to output loudness levels based on DRC gains (e.g., scaling factors that scale audio amplitudes, boost ratios, cut ratios, etc.) looked up with a dynamic range compression curve.

A dynamic range compression curve refers to a function (e.g., a lookup table, a curve, a multi-segment piecewise lines, etc.) that maps individual input loudness levels (e.g., of sounds other than dialogues, etc.) as determined from individual audio data frames to individual gains or gains for dynamic range control. Each of the individual gains indicates an amount of gain to be applied to a corresponding individual input loudness level. Output loudness levels after applying the individual gains represent target loudness levels for audio content in the individual audio data frames in a specific playback environment.

In addition to specifying mappings between gains and loudness levels, a dynamic range compression curve may include, or may be provided with, specific release times and attack times in applying specific gains. An attack refers to an increase of signal energy (or loudness) between successive time samples, whereas a release refers to a decrease of energy (or loudness) between successive time samples. An attack time (e.g., 10 milliseconds, 20 milliseconds, etc.) refers to a time constant used in smoothing DRC gains when the corresponding signal is in attack mode. A release time (e.g., 80 milliseconds, 100 milliseconds, etc.) refers to a time constant used in smoothing DRC gains when the corresponding signal is in release mode. In some embodiments, additionally, optionally or alternatively, the time constants are used for smoothing of the signal energy (or loudness) prior to determining the DRC gain.

Different dynamic range compression curves may correspond to different playback environments. For example, a dynamic range compression curve for a playback environment of a flat panel TV may be different from a dynamic range compression curve for a playback environment of a portable device. In some embodiments, a playback device may have two or more playback environments. For example, a first dynamic range compression curve for a first playback environment of a portable device with speakers may be different from a second dynamic range compression curve for a second playback environment of the same portable device with headset.

3. Audio Decoder

FIG. 1A illustrates an example audio decoder 100 comprising a data extractor 104, dynamic range controller 106, an audio renderer 108, etc.

In some embodiments, the data extractor (104) is configured to receive an encoded input signal 102. An encoded input signal as described herein may be a bit stream that contains encoded (e.g., compressed, etc.) input audio data frames and metadata. The data extractor (104) is configured to extract/decode input audio data frames and metadata from the encoded input signal (102). Each of the input audio data frames comprises a plurality of coded audio data blocks each of which represents a plurality of audio samples. Each frame represents a (e.g., constant) time interval comprising a certain number of audio samples. The frame size may vary with the sample rate and coded data rate. The audio samples are quantized audio data elements (e.g., input PCM samples, input time-frequency samples in a QMF matrix, etc.) representing spectral content in one, two or more (audio) frequency bands or frequency ranges. The quantized audio data elements in the input audio data frames may represent pressure waves in a digital (quantized) domain. The quantized audio data elements may cover a finite range of loudness levels at or below a largest possible value (e.g., a clipping level, a maximum loudness level, etc.).

The metadata can be used by a wide variety of recipient decoder to process the input audio data frames. The metadata may include a variety of operational parameters relating to one or more operations to be performed by the decoder (100), one or more dynamic range compression curves, normalization parameters relating to dialogue loudness levels represented in the input audio data frames, etc. A dialogue loudness level may refer to a (e.g., psychoacoustic, perceptual, etc.) level of dialogue loudness, program loudness, average dialogue loudness, etc., in an entire program (e.g., a movie, a TV program, a radio broadcast, etc.), a portion of a program, a dialogue of a program, etc.

The operation and functions of the decoder (100), or some or all of the modules (e.g., the data extractor 104, the dynamic range controller 106, etc.), may be adapted in response to the metadata extracted from the encoded input signal (102). For example, the metadata—including but not limited to dynamic range compression curves, dialogue loudness levels, etc.—may be used by the decoder (100) to generate output audio data elements (e.g., output PCM samples, output time-frequency samples in a QMF matrix, etc.) in the digital domain. The output data elements can then be used to drive audio channels or speakers to achieve a specified loudness or reference reproduction level during playback in a specific playback environment.

In some embodiments, the dynamic range controller (106) is configured to receive some or all of the audio data elements in the input audio data frames and the metadata, perform audio processing operations (e.g., dynamic range control operations, gain smoothing operations, gain limiting operations, etc.) on the audio data elements in the input audio data frames based at least in part on the metadata extracted from the encoded audio signal (102), etc.

In some embodiments, the dynamic range controller (106) may comprise a selector 110, a loudness calculator 112, DRC gain unit 114, etc. The selector (110) may be configured to determine a speaker configuration (e.g., flat panel mode, portable device with speakers, portable device with headphones, a 5.1 speaker configuration, a 7.1 speaker configuration, etc.) relating to a specific playback environment at the decoder (100), select a specific dynamic range compression curve from the dynamic range compression curves extracted from the encoded input signal (102), etc.

The loudness calculator (112) may be configured to calculate one or more types of loudness levels as represented by the audio data elements in the input audio data frames. Examples of types of loudness levels include, but are not limited only to: any of individual loudness levels over individual frequency bands in individual channels over individual time intervals, broadband (or wideband) loudness levels over a broad (or wide) frequency range in individual channels, loudness levels as determined from or smoothed over an audio data block or frame, loudness levels as determined from or smoothed over more than one audio data block or frame, loudness levels smoothed over one or more time intervals, etc. Zero, one or more of these loudness levels may be altered for the purpose of dynamic range control by the decoder (100).

To determine the loudness levels, the loudness calculator (112) can determine one or more time-dependent physical sound wave properties such as spatial pressure levels at specific audio frequencies, etc., as represented by the audio data elements in the input audio data frames. The loudness calculator (112) can use the one or more time-varying physical wave properties to derive one or more types of loudness levels based on one or more psychoacoustic functions modeling human loudness perception. A psychoacoustic function may be a non-linear function—as constructed based on a model of the human auditory system—that converts/maps specific spatial pressure levels at specific audio frequencies to specific loudness for the specific audio frequencies, etc.

A (e.g., broadband, wideband, etc.) loudness level over multiple (audio) frequencies or multiple frequency bands may be derived through integration of specific loudness level over the multiple (audio) frequencies or multiple frequency bands. Time-averaged, smoothed, etc., loudness levels over one or more time intervals (e.g., longer than that represented by audio data elements in an audio data block or frame, etc.) may be obtained by using one or more smoothing filters that are implemented as a part of the audio processing operations in the decoder (100).

In an example embodiment, specific loudness levels for different frequency bands may be calculated per audio data block of certain (e.g., 256, etc.) samples. Pre-filters may be used to apply frequency weighting (e.g., similar to IEC B-weighting, etc.) to the specific loudness levels in integrating the specific loudness levels into a broadband (or wideband) loudness level. A summation of broad loudness levels over two or more channels (e.g., left front, right front, center, left surround, right surround, etc.) may be performed to provide an overall loudness level of the two or more channels.

In some embodiments, an overall loudness level may refer to a broadband (wideband) loudness level in a single channel (e.g., center, etc.) of a speaker configuration. In some embodiments, an overall loudness level may refer to a broadband (or wideband) loudness level in a plurality of channels. The plurality of channels may be all channels in a speaker configuration. Additionally, optionally or alternatively, the plurality of channels may comprise a subset of channels (e.g., a subset of channels comprising left front, right front, and low frequency effect (LFE); a subset of channels comprising left surround and right surround; etc.) in a speaker configuration.

A (e.g., broadband, wideband, overall, specific, etc.) loudness level may be used as input to look up a corresponding (e.g., static, pre-smoothing, pre-limiting, etc.) DRC gain from the selected dynamic range compression curve. The loudness level to be used as input to look up the DRC gain may be first adjusted or normalized with respect to a dialogue loudness level from the metadata extracted from the encoded audio signal (102).

In some embodiments, the DRC gain unit (114) may be configured with a DRC algorithm to generate gains (e.g., for dynamic range control, for gain limiting, for gain smoothing, etc.), apply the gains to one or more loudness levels in the one or more types of loudness levels represented by the audio data elements in the input audio data frames to achieve target loudness levels for the specific playback environment, etc. The application of gains as described herein (e.g., DRC gains, etc.) may, but is not required to, happen in the loudness domain. In some embodiments, gains may be generated based on the loudness calculation (which may be in Sone or just the SPL value compensated for the dialog loudness level, for example, with no conversion), smoothed and applied directly to the input signal. In some embodiments, techniques as described herein may apply the gains to a signal in the loudness domain, and then convert the signal from the loudness domain back to the (linear) SPL domain and calculate corresponding gains that are to be applied to the signal by assessing the signal before and after the gain was applied to the signal in the loudness domain. The ratio (or difference when represented in a logarithmic dB representation) then determines the corresponding gain for the signal.

In some embodiments, the DRC algorithm operates with a plurality of DRC parameters. The DRC parameters include the dialogue loudness level that has already been computed and embedded into the encoded audio signal (102) by an upstream encoder (e.g., 150, etc.) and can be obtained from the metadata in the encoded audio signal (102) by the decoder (100). The dialogue loudness level from the upstream encoder indicates an average dialogue loudness level (e.g., per program, relative to the energy of a full-scale 1 kHz sine wave, relative to the energy of a reference rectangular wave, etc.). In some embodiments, the dialogue loudness level extracted from the encoded audio signal (102) may be used to reduce inter-program loudness level differences. In an embodiment, the reference dialogue loudness level may be set to the same value between different programs in the same specific playback environment at the decoder (100). Based on the dialogue loudness level from the metadata, the DRC gain unit (114) can apply a dialogue loudness related gain to each audio data block in a program such that an output dialogue loudness level averaged over a plurality of audio data blocks of the program is raised/lowered to a (e.g., pre-configured, system default, user-configurable, profile dependent, etc.) reference dialogue loudness level for the program.

In some embodiments, the DRC gains may be used to address intra-program loudness level differences by boosting or cutting input loudness levels in soft and/or loud sounds in accordance with the selected dynamic range compression curve. One or more of these DRC gains may be computed/determined by the DRC algorithm based on the selected dynamic range compression curve and (e.g., broadband, wideband, overall, specific, etc.) loudness levels as determined from one or more of the corresponding audio data blocks, audio data frames, etc.

Loudness levels used to determine (e.g., static, pre-smoothing, pre-gain limiting, etc.) DRC gains by looking up the selected dynamic range compression curve may be calculated on short intervals (e.g., approximately 5.3 milliseconds, etc.). The integration time of the human auditory system (e.g., approximately 200 milliseconds, etc.) may be much longer. The DRC gains obtained from the selected dynamic range compression curve may be smoothed with a time constant to take into account the long integration time of the human auditory system. To effectuate fast rates of changes (increases or decreases) in loudness levels, short time constants may be used to cause changes in loudness levels in short time intervals corresponding to the short time constants. Conversely, to effectuate slow rates of changes (increases or decreases) in loudness levels, long time constants may be used to changes in loudness levels in long time intervals corresponding to the long time constants.

The human auditory system may react to increasing loudness levels and decreasing loudness levels with different integration time. In some embodiments, different time constants may be used for smoothing the static DRC gains looked up from the selected dynamic range compression curves, depending on whether the loudness level will be increasing or decreasing. For example, in correspondence with the characteristics of the human auditory system, attacks (loudness level increasing) are smoothed with relatively short time constants (e.g., attack times, etc.), whereas releases (loudness level decreasing) are smoothed with relatively long time constants (e.g., release time, etc.).

A DRC gain for a portion (e.g., one or more of audio data blocks, audio data frames, etc.) of audio content may be calculated using a loudness level determined from the portion of audio content. The loudness level to be used for looking up in the selected dynamic range compression curve may be first adjusted with respect to (e.g., in relation to, etc.) a dialogue loudness level (e.g., in a program of which the audio content is a part, etc.) in the metadata extracted from the encoded audio signal (102).

A reference dialogue loudness level (e.g., $-31$ $dB_{FS}$ in the "Line" mode, $-20$ $dB_{FS}$ in the "RF" mode, etc.) may be specified or established for the specific playback environment at the decoder (100). Additionally, alternatively or optionally, in some embodiments, users may be given control over setting or changing the reference dialogue loudness level at the decoder (100).

The DRC gain unit (114) can be configured to determine a dialogue loudness related gain to the audio content to cause a change from the input dialogue loudness level to the reference dialogue loudness level as the output dialogue loudness level.

In some embodiments, the DRC gain unit (114) may be configured to handle peak levels in the specific playback environment at the decoder (100) and adjusts the DRC gains to prevent clipping. In some embodiments, under a first approach, if the audio content extracted from the encoded audio signal (102) comprise audio data elements for a reference multi-channel configuration with more channels than those of the specific speaker configuration at the decoder (100), downmixing from the reference multi-channel configuration to the specific speaker configuration may be performed before determining and handle peak levels for the purpose of clipping prevention. Additionally, optionally, or alternatively, in some embodiments, under a second approach, if the audio content extracted from the encoded audio signal (102) comprise audio data elements for a reference multi-channel configuration with more channels than those of the specific speaker configuration at the decoder (100), downmix equations (e.g., ITU stereo downmix, matrixed-surround compatible downmix, etc.) may be used to obtain the peak levels for the specific speaker configuration at the decoder (100). The peak level may be adjusted to reflect the change from the input dialogue loudness level to the reference dialogue loudness level as the output dialogue loudness level. A maximum allowed gain without causing clipping (e.g., for an audio data block, for an audio data frame, etc.) may be determined based at least in part on an inverse (e.g., multiplied with −1, etc.) of the peak level. Thus, an audio decoder under techniques as described herein can be configured to determine peak levels accurately and apply clipping prevention specifically for the playback configuration at the decoder side; neither the audio decoder nor the audio encoder is required to make hypothetical assumptions about any worst-case scenarios at hypothetical decoders. In particular, the decoder in the first approach as described above can determine peak levels accurately and apply clip prevention after downmixing without using downmixing equations, downmix channel gains, etc., which would be used under the second approach as described above.

In some embodiments, a combination of the adjustments to the dialogue loudness level and the DRC gain prevents clipping in the peak level, possibly even in the worst-case downmix (e.g., producing the largest peak levels after downmixing, producing the largest downmix channel gains, etc.). However, in some other embodiments, the combination of the adjustments to the dialogue loudness level and the DRC gain may still not be sufficient in preventing clipping in the peak level. In these embodiments, the DRC gain may be replaced (e.g., capped, etc.) by the highest gain that does prevent clipping in the peak level.

In some embodiments, the DRC gain unit (114) is configured to get time constants (e.g., attack times, release times, etc.) from the metadata extracted from the encoded audio signal (102). The DRC gain, the time constants, the maximum allowed gain, etc., may be used by the DRC gain unit (114) to perform DRC, gain smoothing, gain limiting, etc.

For example, the application of the DRC gain may be smoothed with a filter controlled by a time constant. A gain limiting operation may be implemented by a min( ) function that takes the lower of a gain to be applied and a maximum allowed gain for the gain, through which the (e.g., pre-limiting, DRC, etc.) gain may be replaced immediately, over a relatively short time interval, etc., with the maximum allowed gain, thereby preventing clipping.

In some embodiments, the audio renderer (108) is configured to generate (e.g., multi-channel, etc.) channel-specific audio data (116) for the specific speaker configuration after applying gains as determined based on DRC, gain limiting, gain smoothing, etc., to the input audio data extracted from the encoded audio signal (102). The channel-specific audio data (118) may be used to drive speakers, headphones, etc., represented in the speaker configuration.

Additionally and/or optionally, in some embodiments, the decoder (100) can be configured to perform one or more other operations relating to preprocessing, post-processing, rendering, etc., relating to the input audio data.

Techniques as described herein can be used with a variety of speaker configurations corresponding to a variety of different surround sound configurations (e.g., 2.0, 3.0, 4.0, 4.1, 4.1, 5.1, 6.1, 7.1, 7.2, 10.2, a 10-60 speaker configuration, a 60+ speaker configuration, etc.) and a variety of different rendering environment configurations (e.g., cinema, park, opera houses, concert halls, bars, homes, auditoriums, etc.).

4. Audio Encoder

Figure 1B:
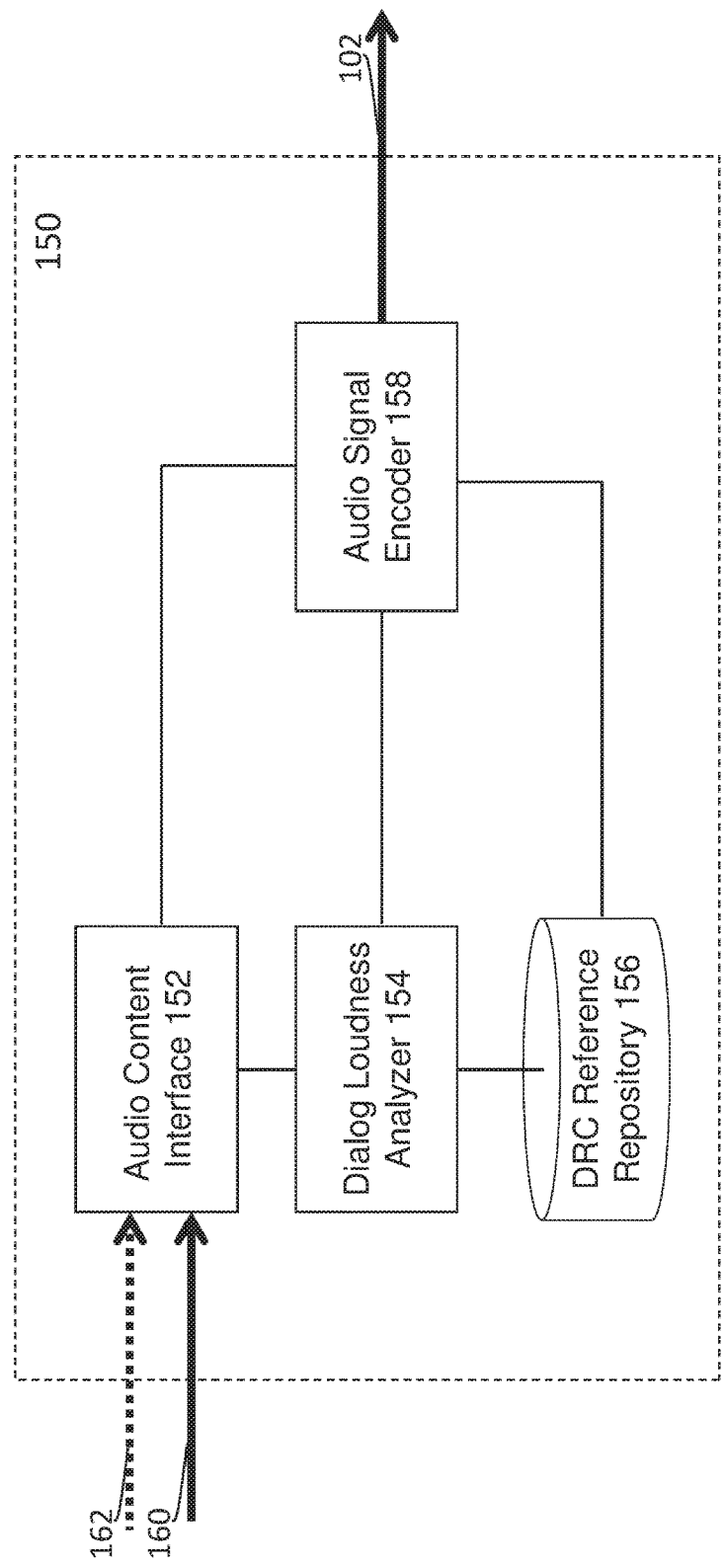

FIG. 1B illustrates an example encoder 150. The encoder (150) may comprise an audio content interface 152, a dialogue loudness analyzer 154, a DRC reference repository 156, an audio signal encoder 158, etc. The encoder 150 may be a part of a broadcast system, an internet-based content server, an over-the-air network operator system, a movie production system, etc.

In some embodiments, the audio content interface (152) is configured to receive audio content 160, audio content control input 162, etc., generate an encoded audio signal (e.g., 102) based at least on some or all of the audio content (160), the audio content control input (162), etc. For example, the audio content interface (152) may be used to receive the audio content (160), the audio content control input (162) from a content creator, a content provider, etc.

The audio content (160) may constitute some or all of overall media data that comprises audio only, audiovisual, etc. The audio content (160) may comprise one or more of portions of a program, a program, several programs, one or more commercials, etc.

In some embodiments, the dialogue loudness analyzer (154) is configured to determine/establish one or more dialogue loudness levels of one or more portions (e.g., one or more programs, one or more commercials, etc.) of the audio content (152). In some embodiments, the audio content is represented by one or more sets of audio tracks. In some embodiments, dialogue audio content of the audio content is in separate audio tracks. In some embodiments, at least a portion of dialogue audio content of the audio content is in audio tracks comprising non-dialogue audio content.

The audio content control input (162) may comprise some or all of user control input, control input provided by a system/device external to the encoder (150), control input from a content creator, control input from a content provider, etc. For example, a user such as a mixing engineer, etc., can provide/specify one or more dynamic range compression curve identifiers; the identifiers may be used to retrieve one or more dynamic range compression curves that fit the audio content (160) best from a data repository such as a DRC reference repository (156), etc.

In some embodiments, the DRC reference repository (156) is configured to store DRC reference parameter sets, etc. The DRC reference parameter sets may include definition data for one or more dynamic range compression curves, etc. In some embodiments, the encoder (150) may (e.g., concurrently, etc.) encode more than one dynamic range compression curve into the encoded audio signal (102). Zero, one, or more of the dynamic range compression curves may be standard-based, proprietary, customized, decoder-modifiable, etc. In an example embodiment, both dynamic range compression curves of FIG. 2A and FIG. 2B can be (e.g., concurrently, etc.) encoded into the encoded audio signal (102).

In some embodiments, the audio signal encoder (158) can be configured to receive the audio content from the audio content interface (152), the dialogue loudness levels from the dialogue loudness analyzer (154), etc., retrieve one or more DRC reference parameter sets from the DRC reference repository (156), format audio content into audio data blocks/frames, format the dialogue loudness levels, the DRC reference parameter sets, etc., into metadata (e.g., metadata containers, metadata fields, metadata structures, etc.), encode the audio data blocks/frames and the metadata into the encoded audio signal (102), etc.

Audio content to be encoded into an encoded audio signal as described herein may be received in one or more of a variety of source audio formats in one or more of a variety of ways, such as wirelessly, via a wired connection, through a file, via an internet download, etc.

one or more IC circuits (e.g., ASICs, FPGAs, etc.), in hardware, software, or a combination of hardware and software.

5. Dynamic Range Compression Curves

Figure 2A:
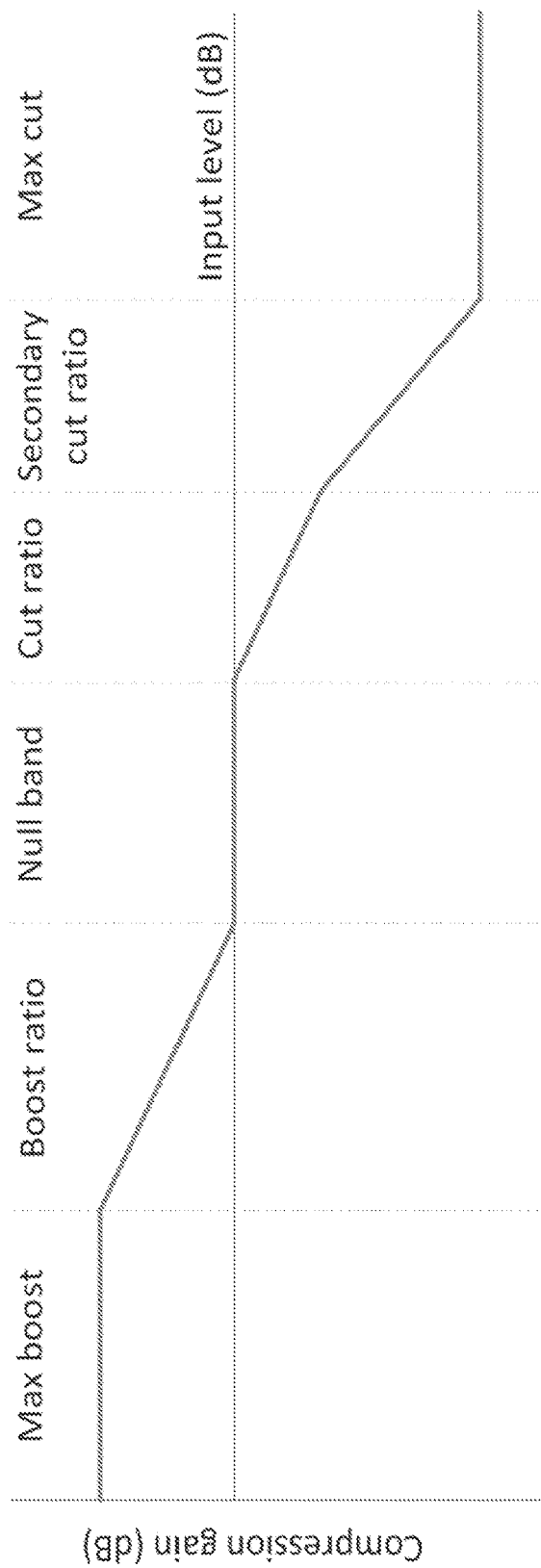
FIG. 2A and FIG. 2B illustrate example dynamic range compression curves.
Figure 2B:
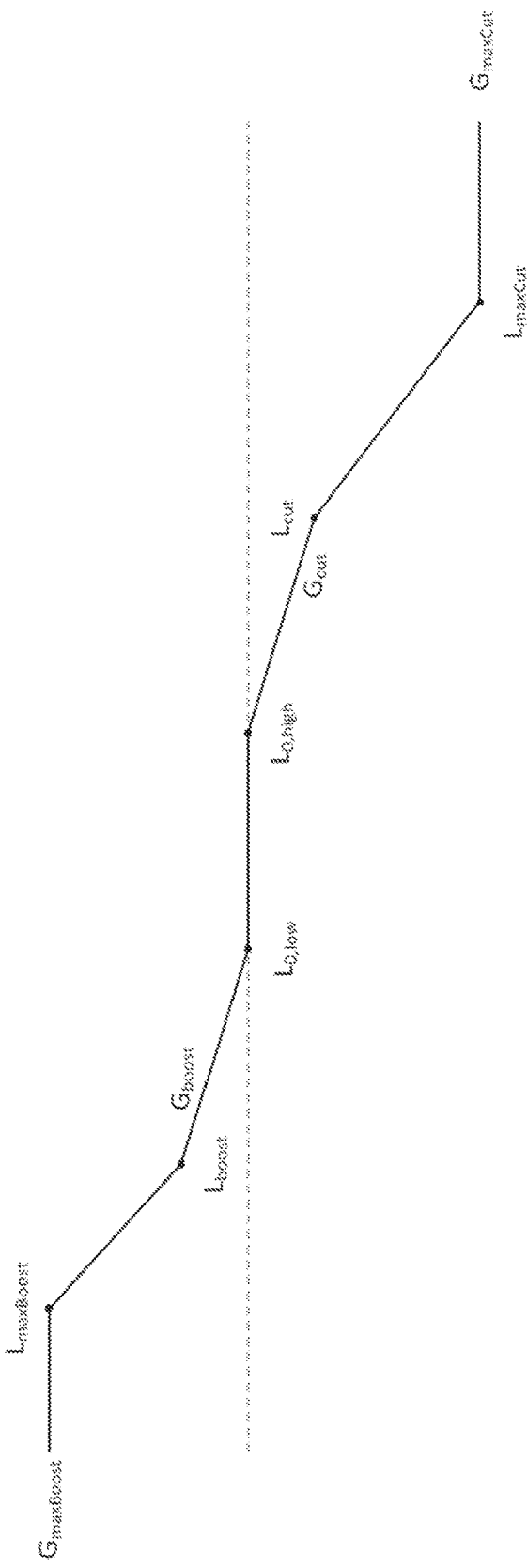

FIG. 2A and FIG. 2B illustrate example dynamic range compression curves that can be used by the DRC gain unit (104) in the decoder (100) to derive the DRC gains from input loudness levels. As illustrated, a dynamic range compression curve may be centered around a reference loudness level in a program in order to provide overall gains that are appropriate for the specific playback environment. Example definition data (e.g., in the metadata of the encoded audio signal 102, etc.) of the dynamic range compression curve (e.g., including but not limited only to any of: boost ratios, cut ratios, attack times, release times, etc.) are shown in the following table, where each profile in a plurality of profiles (e.g., film standard, film light, music standard, music light, speech, etc.) represents a specific playback environment (e.g., at the decoder 100, etc.):

TABLE 1

| Parameter | Profile | | | | |
|---|---|---|---|---|---|
| | Film standard | Film light | Music Standard | Music light | Speech |
| Time Constant Selection | | | | | |
| Attack Threshold (dB) | 15 | 15 | 15 | 15 | 10 |
| Release Threshold (dB) | 20 | 20 | 20 | 20 | 10 |
| Fast Attack Time Constant (ms) | 10 | 10 | 10 | 10 | 10 |
| Slow Attack Time Constant (ms) | 100 | 100 | 100 | 100 | 100 |
| Slow Release Time Constant (ms) | 3000 | 3000 | 10000 | 3000 | 1000 |
| Fast Release Time Constant (ms) | 1000 | 1000 | 1000 | 1000 | 200 |
| Holdoff period (ms) | 53 | 53 | 53 | 53 | 53 |
| Compression Curve | | | | | |
| Maximum Boost (dB) | 6 | 6 | 12 | 12 | 15 |
| Maximum Boost Range (<=dB) | −43 | −53 | −55 | −65 | −50 |
| Boost Ratio | 2:1 | 2:1 | 2:1 | 2:1 | 19:15 |
| Boost Range (dB) | [−43, . . . , −31] | [−53, . . . , −41] | [−55, . . . , −31] | [−65, . . . , −41] | [−50, . . . , −31] |
| Null Band Width (dB) | 5 | 20 | 5 | 20 | 5 |
| Null Band Range (dB) | [−31, . . . , −26] | [−41, . . . , −21] | [−31, . . . , −26] | [−41, . . . , −21] | [−31, . . . , −26] |
| Cut Ratio | 2:1 | 2:1 | 2:1 | 2:1 | 2:1 |
| Cut Ratio Range (dB) | [−26, . . . , −16] | [−21, . . . , −11] | [−26, . . . , −16] | [−21, . . . , −27] | [−26, . . . , −16] |
| Secondary Cut Ratio | 20:19 | 20:19 | 20:19 | | 20:19 |
| Secondary Cut Ratio Range (dB) | [−16, . . . , 4] | [−11, . . . , 9] | [−16, . . . , 4] | | [−16, . . . , 4] |
| Maximum Cut (dB) | −24 | −24 | −24 | −24 | −24 |
| Maximum Cut Range (>=dB) | 4 | 9 | 4 | 27 | 4 |

An encoded audio signal as described herein can be a part of an overall media data bitstream (e.g., for an audio broadcast, an audio program, an audiovisual program, an audiovisual broadcast, etc.). The media data bitstream can be accessed from a server, a computer, a media storage device, a media database, a media file, etc. The media data bit stream may be broadcasted, transmitted or received through one or more wireless or wired network links. A media data bitstream may also be communicated through an intermediary such as one or more of network connections, USB connections, wide area networks, local area networks, wireless connections, optical connections, buses, crossbar connections, serial connections, etc.

Any of the components depicted (e.g., FIG. 1A, FIG. 1B, etc.) may be implemented as one or more processes and/or Some embodiments may receive one or more compression curves described in terms of loudness levels in $dB_{SPL}$ or $dB_{FS}$ and gains in dB relating to $dB_{SPL}$, whereas DRC gain calculation is performed in a different loudness representation that has a non-linear relation with $dB_{SPL}$ loudness levels (e.g. Sone). The compression curve used in the DRC gain calculation may then be converted to be described in terms of the different loudness representation (e.g. Sone).

6. DRC Gains, Gain Limiting and Gain Smoothing

Figure 3:
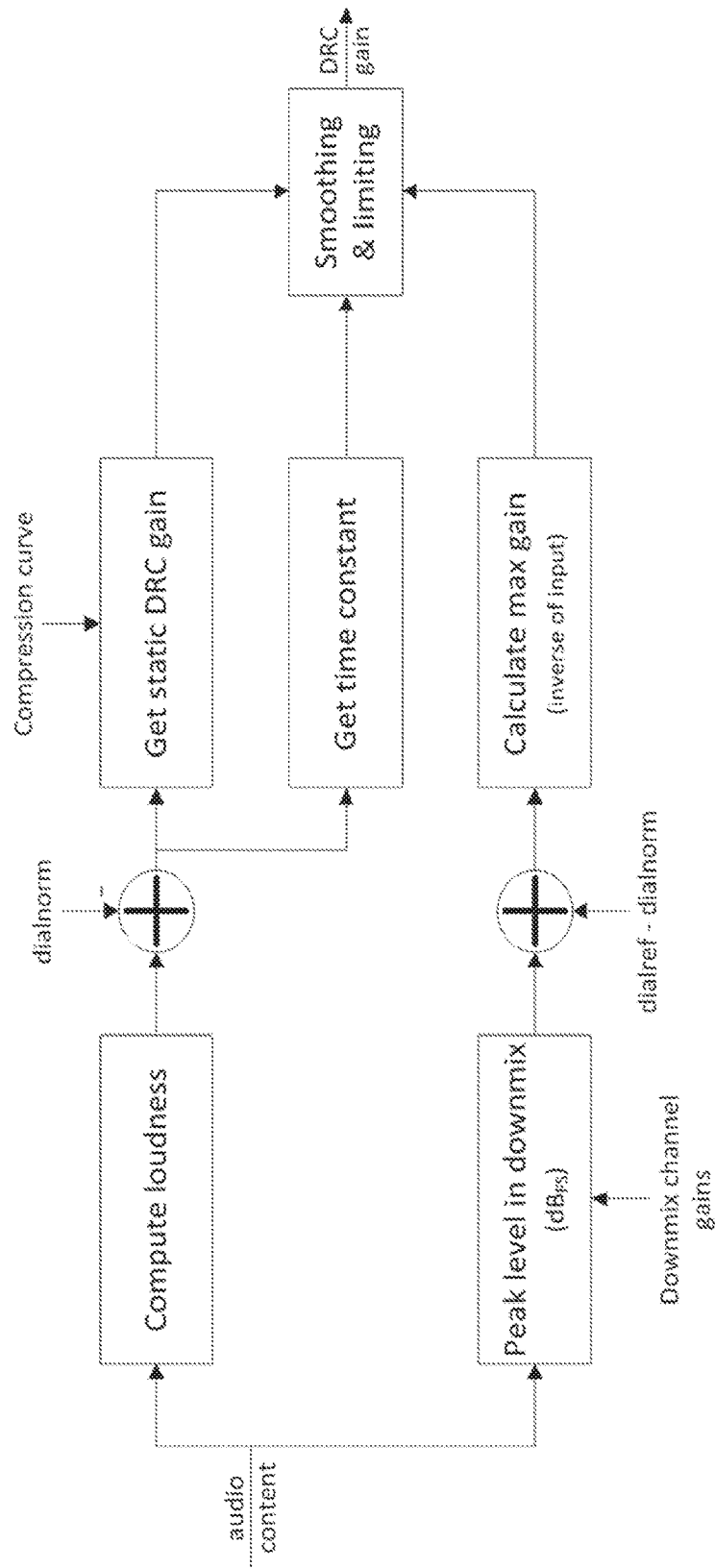
FIG. 3 illustrates example processing logic of determination/calculation of combined DRC and limiting gains.

FIG. 3 illustrates example processing logic of determination/calculation of combined DRC and limiting gains. The processing logic may be implemented by the decoder (100), the encoder (150), etc. For the purpose of illustration only, a DRC gain unit (e.g., 114) in a decoder (e.g., 100, etc.) may be used to implement the processing logic.

A DRC gain for a portion (e.g., one or more of audio data blocks, audio data frames, etc.) of audio content may be calculated using a loudness level determined from the portion of audio content. The loudness level may be first adjusted with respect to (e.g., in relation to, etc.) a dialogue loudness level (e.g., in a program of which the audio content is a part, etc.) in the metadata extracted from the encoded audio signal (102). In an example as illustrated in FIG. 3, a difference between the loudness level of the portion of audio content and the dialogue loudness level ("dialnorm") may be used as an input to look up the DRC gain from the selected dynamic range compression curve.

In order to prevent clipping in the output audio data elements in the specific playback environment, the DRC gain unit (114) may be configured to handle peak levels in a specific playback scenario (e.g., specific to the particular combination of the encoded audio signal 102 and the playback environment at the decoder 100, etc.), which may be one in a variety of possible playback scenarios (e.g., multi-channel scenarios, downmix scenarios, etc.).

In some embodiments, individual peak levels for individual portions of the audio content at a particular time resolution (e.g., audio data block, several audio data blocks, an audio data frame, etc.) may be provided as a part of the metadata extracted from the encoded audio signal (102).

In some embodiments, the DRC gain unit (114) can be configured to determine the peak level in these scenarios and adjusts the DRC gains if necessary. During the calculation of the DRC gain, a parallel process may be used by the DRC gain unit (114) to determine the peak level of the audio content. For example, the audio content may be encoded for a reference multi-channel configuration that has more channels than those of a specific speaker configuration used by the decoder (100). The audio content for the more channels of the reference multi-channel configuration may be converted into a downmixed audio data (e.g., ITU stereo downmix, matrixed-surround compatible downmix, etc.) to drive the fewer channels for the specific speaker configuration at the decoder (100). In some embodiments, under a first approach, downmixing from the reference multi-channel configuration to the specific speaker configuration may be performed before determining and handle peak levels for the purpose of clipping prevention. Additionally, optionally, or alternatively, in some embodiments, under a second approach, downmix channel gains relating to downmixing the audio content may be used as a part of input to adjust, derive, compute, etc., the peak level for the specific speaker configuration. In an example embodiment, the downmix channel gains may be derived based at least in part on one or more downmix equations used to carry out the downmix operation from the reference multi-channel configuration to the specific speaker configuration in the playback environment at the decoder (100).

In some media applications, a reference dialogue loudness level (e.g., −3 ldB$_{FS}$ in the "Line" mode, −20 dB$_{FS}$ in the "RF" mode, etc.) may be specified or assumed for the specific playback environment at the decoder (100). In some embodiments, users may be given control over setting or changing the reference dialogue loudness level at the decoder (100).

A dialogue loudness related gain may be applied to the audio content to adjust the (e.g., output) dialogue loudness level to the reference dialogue loudness level. The peak level should be adjusted accordingly to reflect this adjustment. In an example, the (input) dialogue loudness level may be −23 dB$_{FS}$. In a "Line" mode with a reference dialogue loudness level of −31 dB$_{FS}$, the adjustment to the (input) dialogue loudness level is −8 dB to produce an output dialogue loudness level at the reference dialogue loudness level. In the "Line" mode, the adjustment to the peak level is also −8 dB, the same as the adjustment to the dialogue loudness level. In an "RF" mode with a reference dialogue loudness level of −20 dB$_{FS}$, the adjustment to the (input) dialogue loudness level is 3 dB to produce an output dialogue loudness level at the reference dialogue loudness level. In the "RF" mode, the adjustment to the peak level is also 3 dB, the same as the adjustment to the dialogue loudness level.

A sum of the peak level and a difference between the reference dialogue loudness level (denoted as "dialref") and the dialogue loudness level ("dialnorm") in the metadata from the encoded audio signal (102) may be used as an input to compute a maximum (e.g., allowed, etc.) gain for the DRC gain. Since the adjusted peak level is expressed in dB$_{FS}$ (relative to the clipping level at 0 dB$_{FS}$), the maximum allowed gain without causing clipping (e.g., for the current audio data block, for the current audio data frame, etc.) is simply the inverse (e.g., multiplied with −1, etc.) of the adjusted peak level.

In some embodiments, the peak level may exceed a clipping level (denoted as 0 dB$_{FS}$), even if the dynamic range compression curve from which the DRC gain was derived is designed to cut loud sounds to a certain extent. In some embodiments, a combination of the adjustments to the dialogue loudness level and the DRC gain prevents clipping in the peak level, possibly even in the worst-case downmix (e.g., producing the largest downmix channel gains, etc.). However, in some other embodiments, the combination of the adjustments to the dialogue loudness level and the DRC gain may still not be sufficient in preventing clipping in the peak level. In these embodiments, the DRC gain may be replaced (e.g., capped, etc.) by the highest gain that does prevent clipping in the peak level.

In some embodiments, the DRC gain unit (114) is configured to get time constants (e.g., attack times, release times, etc.) from the metadata extracted from the encoded audio signal (102). These time constants may or may not vary with one or more of the dialogue loudness level or the current loudness level of the audio content. The DRC gain looked up from the dynamic range compression curve, the time constants, and the maximum gain may be used to perform gain smoothing and limiting operations.

In some embodiments, the DRC gain which may possibly be gain limited does not exceed the maximum peak loudness level in the specific playback environment. The static DRC gain derived from the loudness level may be smoothed with a filter controlled by a time constant. The limiting operations may be implemented by one or more min( )functions, through which the (pre-limiting) DRC gain may be replaced immediately, over a short time interval, etc., with the maximum allowed gain, thereby preventing clipping. The DRC algorithm may be configured to smoothly release from the clipping gain to a lower gain as the peak levels of incoming audio content moves from above the clipping level to below the clipping level.

One or more different (e.g., real time, two-pass, etc.) implementations may be used to carry out the determination/calculation/application of DRC gains as illustrated in FIG. 3. For the purpose of illustration only, the adjustments to the dialogue loudness level, the (e.g., static, etc.) DRC gains, the time-dependent gain variations due to smoothing, gain clipping due to limiting, etc., have been described as combined gains from the DRC algorithm as described above. However, other approaches of applying gains to audio content for controlling dialogue loudness levels (e.g., between different programs, etc.), for dynamic range control (e.g., for different portions of the same program, etc.), for preventing clipping, for gain smoothing, etc., may be used in various embodiments. For example, some or all of the adjustments to the dialogue loudness level, the (e.g., static, etc.) DRC gains, the time-dependent gain variations due to smoothing, gain clipping due to limiting, etc., may be partially/individually applied, applied in series, applied in parallel, applied in part series in part parallel, etc.

7. Input Smoothing and Gain Smoothing

In addition to DRC gain smoothing, other smoothing processes under techniques as described herein may be implemented in various embodiments. In an example, input smoothing may be used to smooth input audio data extracted from the encoded audio signal (102), for example with a simple single pole smoothing filter, to obtain a spectrum of specific loudness levels that has better temporal characteristics (e.g., more smooth in time, less spiky in time, etc.) than a spectrum of specific loudness levels without input smoothing.

In some embodiments, different smoothing processes as described herein can use different time constants (e.g., 1 second, 4 seconds, etc.). In some embodiments, two or more smoothing processes can use a same time constant. In some embodiments, time constants used in smoothing processes as described herein can be frequency-dependent. In some embodiments, time constants used in smoothing processes as described herein can be frequency-independent.

One or more smoothing processes may be connected to a reset process that supports an automatic or manual reset of the one or more smoothing processes. In some embodiments, when a reset occurs in the reset process, a smoothing process may speed up smoothing operations by switching or transferring to a smaller time constant. In some embodiments, when a reset occurs in the reset process, the memory of a smoothing process may be reset to a certain value. This value may be the last input sample to the smoothing process.

8. DRC Over Multiple Frequency Bands

In some embodiments, specific loudness levels in specific frequency bands can be used to derive corresponding DRC gains in the specific frequency bands. This, however, may result in timbre changes as the specific loudness levels can vary significantly in different bands and thus incur different DRC gains, even as a broadband (or wideband) loudness level over all the frequency bands remains constant.

In some embodiments, rather than applying DRC gains that vary with individual frequency bands, DRC gains that do not vary with frequency bands but vary with time are applied instead. The same time-varying DRC gains are applied across all of the frequency bands. The time-averaged DRC gains of the time-varying DRC gains may be set to the same as static DRC gains derived from the selected dynamic range compression curve based on broadband, wideband, and/or overall loudness levels over a broadband (or wideband) range or a plurality of frequency bands. As a result, changes to the timbre effects that might be caused by applying different DRC gains in different frequency bands in other approaches can be prevented.

In some embodiments, DRC gains in individual frequency bands are controlled with a broadband (or wideband) DRC gain determined based on a broadband (or wideband) loudness level. The DRC gains in the individual frequency bands may operate around the broadband (or wideband) DRC gain looked up in dynamic range compression curve based on the broadband (or wideband) loudness level, so that the DRC gains in the individual frequency bands as time-averaged over a certain time interval (e.g., longer than 5.3 milliseconds, 20 milliseconds, 50 milliseconds, 80 milliseconds, 100 milliseconds, etc.) are the same as the broadband (or wideband) level as indicated in the dynamic range compression curve. In some embodiments, loudness level fluctuations over short time intervals relative to the certain time interval deviating from the time-averaged DRC gains are permissible among channels and/or frequency bands. The approach ensures the application of correct multi-channel and/or multiband time-averaged DRC gains as indicated in the dynamic range compression curve and prevents the DRC gains in the short time intervals from deviating too much from such time-averaged DRC gains as indicated in the dynamic range compression curve.

9. Volume Adjustment in Loudness Domain

Applying linear processing for volume adjustment to audio excitation signals under other approaches that do not implement techniques as described herein may cause low audible signal levels to become inaudible (e.g., falling below the frequency dependent hearing threshold of the human auditory system, etc.).

Under techniques as described herein, volume adjustments of audio content may be made or implemented in the loudness domain (e.g., with a Sone representation, etc.), rather than the physical domain (e.g., with a $dB_{SPL}$ representation, etc.). In some embodiments, loudness levels in all bands are scaled with the same factor in the loudness domain for the purpose of maintaining perceptual qualities and/or integrity of loudness level relationships among all the bands at all volume levels. The volume adjustments based on setting and adjusting gains in the loudness domain as described herein may be converted back to, and implemented through, non-linear processing in the physical domain (or in the digital domain representing the physical domain) that applies different scaling factors to audio excitation signals in different frequency bands. The non-linear processing in the physical domain, converted from the volume adjustments in the loudness domain under techniques as described herein, attenuates or enhances loudness levels of audio content with DRC gains that prevent most or all of low audible levels in the audio content from becoming inaudible. In some embodiments, loudness level differences between loud and soft sounds within a program are reduced but not perceptually obliterated with these DRC gains to maintain the low audible signal levels above the hearing threshold of the human auditory system. In some embodiments, at low volume levels, frequencies or frequency bands with excitation signal levels close to the threshold of hearing are less attenuated thus are perceptually audible, in order to maintain a similarity of spectral perception and perceived timbre, etc., across a large range of volume levels.

Techniques as described herein may implement conversions (e.g., back and forth, etc.) between signal levels, gains, etc. in the physical domain (or in the digital domain representing the physical domain) and loudness levels, gains, etc., in the loudness domain. These conversions may be based on forward and inverse versions of one or more non-linear functions (e.g., mappings, curves, piece-wise linear segments, look-up tables, etc.) constructed based on a model of the human auditory system.

10. Downmix Loudness Adjustment

In some embodiments, the audio content (152) is encoded in the encoded audio signal (102) for a reference speaker configuration (e.g. a surround sound configuration, a 5.1 speaker configuration, etc.) that comprises a plurality of audio channels or speakers.

A recipient decoder that operates with a specific speaker configuration with a smaller number of audio channels or speakers (e.g., a two-channel headset configuration, etc.) is expected to downmix (e.g., with one or more downmix equations, etc.) the audio content (152) as received from the encoded audio signal (102) from the plurality of audio channels in the reference speaker configuration to the smaller number of audio channels in the decoder's specific speaker configuration, perform gain adjustments to the downmix audio content, produce a downmix output sound output, etc.

Loudness levels as measured in the reference speaker configuration for individual portions of the audio content (152) may be different from loudness levels as measured in the specific speaker configuration such as a two-channel configuration, etc., for the same individual portions of the audio content (152). For example, if a portion of the audio content (152) before downmixing has a particular channel-dependent sound distribution that concentrates in left front and right front channels of the reference speaker configuration, the loudness level of the same portion of the audio content (152) after downmixing to the two-channel configuration may be higher or louder than the loudness level of the same portion of the audio content (152) in the reference speaker configuration before downmixing. On the other hand, if a portion of the audio content (152) before downmixing has a particular channel-dependent sound distribution that concentrates in other channels other than the left front and right front channels of the reference speaker configuration, the loudness level of the same portion of the audio content (152) after downmixing to the two-channel configuration may be lower or quieter than the loudness level of the same portion of the audio content (152) in the reference speaker configuration before downmixing.

In some embodiments, an audio encoder (e.g., 150, etc.) as described herein is configured to provide downmix related metadata (e.g., comprising one or more downmix loudness parameters, etc.) to downstream audio decoders. The downmix related metadata from the audio encoder (150) can be used by downstream audio decoders to efficiently and consistently perform (e.g., in real time, in near real time, etc.) downmix related gain adjustment operations, to allow the downstream audio decoders to produce relatively accurate actual target loudness levels in downmix sound outputs, to prevent inconsistencies in measured loudness levels between the reference speaker configuration and the decoders' specific speaker configurations, etc.

In some embodiments, the audio encoder (150) determines one or more downmix parameters based at least in part on the audio content (152) encoded for a reference speaker configuration and a specific speaker configuration (e.g., a two-channel configuration, etc.) that is different from the reference speaker configuration. In some embodiments, the downmix loudness parameters comprise one or more different sets of downmix loudness parameters for different types of downmixing operations. The downmix loudness parameters may comprise a single set of downmix loudness parameters to be used by downstream audio decoders to perform a specific type of downmixing such as LtRt downmixing, LoRo downmixing, etc. The downmix loudness parameters may comprise two or more sets of downmix loudness parameters to be used by downstream audio decoders to perform any of two or more specific types of downmixing such as LtRt downmixing, LoRo downmixing, etc. The downmix loudness data generated by the audio encoder (150) can carry one or more specific flags to indicate the presence of one or more sets of downmixing loudness parameters for one or more different types of downmixing operations. The downmix loudness data may also include a preference flag to indicate which type of downmixing operations is preferred for the audio content to be downmixed. The downmix loudness parameters may be delivered to a downstream decoder as a part of metadata delivered in an encoded audio signal (102) that include the audio content (152) encoded for the reference speaker configuration.

Examples of downmix loudness parameters as described herein may include, but are not limited to only: any of one or more downmix loudness metadata indicators, one or more downmix loudness data fields, etc. In an example embodiment, the downmix loudness parameters may comprise an indicator (e.g., a one-bit data field denoted as "dmixloudoffste", etc.) to indicate whether downmix loudness offset data exists, a data field (e.g., a 5-bit data field denoted as "5-bit dmixloudoffst", etc.) to indicate a downmix loudness offset, etc. In some embodiments, one or more instances of these indicators and data fields may be generated by the audio encoder (150) for one or more different types of downmixing operations.

In some embodiments, the "dmixloudoffste" field may be set to one (1), only when the encoded audio signal (102) carries audio data (e.g., audio samples, etc.) for more than two channels; the "dmixloudoffst" field may be carried if the "dmixloudoffste" field is set to one (1). In an example in which the encoded audio signal (102) is an AC-3 or E-AC-3 bitstream, etc., the "dmixloudoffste" field may be set to one (1), when an audio coding mode (e.g., "acmod", etc.) for the AC-3 or E-AC-3 bitstream is set to a value greater than 2; such a value of the audio coding mode indicates that the reference speaker configuration is a multi-channel speaker configuration comprising more than two audio channels or speakers, and is neither a center-speaker-only configuration (e.g., with a value of 1 for "acmod", etc.) nor a left-front-and-right-front-only speaker configuration (e.g., with a value of 2 for "acmod", etc.).

The "dmixloudoffst" field may be used to indicate a difference between the expected loudness of a downmix sound output from an (e.g., assumed, expected, etc.) audio decoder (e.g., an AC-3 decoder, an E-AC-3 decoder, etc.), and the measured loudness of such a downmix sound output, with some or all of gain adjustments due to dialogue normalization, dynamic range compression, fixed attenuation to protect against downmix overload, etc., having been applied prior to performing measurements that yield the measured loudness. In some embodiments, the measured loudness comprises one or more different sets of downmix loudness measurements for one or more different types of the downmix sound output with one or more different sets of gain adjustments. In some embodiments, the audio encoder (150) generates one or more downmixes based on one or more types (e.g., LtRt downmixing operation, LoRo downmixing operation, etc.) of downmixing operations. For example, the audio encoder (150) can apply one or more different sets of downmix coefficients/equations (e.g., LtRt downmix coefficients/equations, LoRo downmix coefficients/equations, etc.) to the audio content encoded for the (e.g., multichannel, etc.) reference speaker configuration to generate the one or more downmixes. In some embodiments, the audio encoder (150) may apply one or more different sets of gain adjustments to one or more of the downmixes to generate one or more different types of the downmix sound output for loudness measurements. Examples of sets of gain adjustments include but are not limited only to: any of a set of gain adjustments with null gain, a set of gain adjustments including gain adjustments relating to dynamic range compression, a set of gain adjustments including gain adjustments relating to dialog normalization, a set of gain adjustments excluding gain adjustments relating to dynamic range compression, a set of gain adjustments excluding gain adjustments relating to dialog normalization, a set of gain adjustments including gain adjustments relating to both dynamic range compression and dialog normalization, etc. After the one or more different types of the downmix sound output for loudness measurements are generated based on one or more different combinations of the one or more different sets of gain adjustments and the one or more of the downmixes, the audio encoder (150) can generate the measured loudness by making one or more different sets of downmix loudness measurements in any, some, or all of the one or more different types of the downmix sound output. The measured loudness may be made by the audio encoder (150) in any of a variety of loudness measurement standards (e.g., LKFS, LUFS, etc.), methods, tools, etc. For the purpose of illustration only, the measured loudness may be represented by a LKFS value.

In some embodiments, the audio encoder (150) assumes that an audio decoder (e.g., 100, etc.) described herein that is to decode the encoded audio signal (102) with a dialog loudness level (e.g., "dialnorm", etc.) is expected to apply a certain amount of attenuation (e.g., a difference between a reference loudness level and "dialnorm", etc.) during decoding to align/adjust an output dialog loudness level of the downmixed sound output to the reference loudness level. For example, if the dialog loudness level "dialnorm" (e.g., as determined from the audio content (152) encoded for the reference speaker configuration such as a 5.1 speaker configuration, etc.) has a value of −24 $dB_{FS}$, and if the reference loudness level for the decoder's specific speaker configuration (e.g., a two-channel configuration to which the audio content (152) is to be downmixed, etc.) is −31 LKFS, then the audio decoder (100) is expected to apply an attenuation of 7 dB to align/adjust the output dialog loudness level to the reference loudness level. In some embodiments, the reference loudness level (e.g., −31 LKFS, etc.) for the decoder's specific speaker configuration represents the expected loudness level (e.g., of a 2-channel downmix sound output, etc.).

In some embodiments, the "dmixloudoffst" field may be used by the audio encoder (150) to indicate any loudness deviation between (1) the expected loudness level of the 2-channel downmix sound output and (2) the measured loudness level of the 2-channel downmix sound output, as measured after some or all of gain adjustments due to dialogue normalization, dynamic range compression, fixed attenuation to protect against downmix overload, etc., have been applied. The "dmixloudoffst" field may comprise one or more instances for one or more different types of downmixes after applying one or more different sets of gain adjustment, etc. The loudness deviation as indicated by the "dmixloudoffst" field may, but is not limited to only, include loudness level differences caused by downmixing audio content from a reference speaker configuration to a specific speaker configuration such as the two-channel configuration, etc. The loudness deviation corresponds to (e.g., represents the opposite to, etc.) a loudness offset that should be applied by a decoder with a specific speaker configuration to which the audio content (152) is to be downmixed, in order to produce the reference loudness level in the downmix sound output.

In an example implementation, the "dmixloudoffst" field (e.g., an instance thereof, etc.) may be set to a value in a (e.g., integer, etc.) value range from 0 to 30, corresponding to a range of loudness offsets from −7.5 LKFS to +7.5 LKFS, in 0.5 LKFS steps. Additionally, optionally, or alternatively, a value of 31 for the "dmixloudoffst" field may be designated as a reserved value, and if present, may be interpreted as a downmix loudness offset of 0 LKFS.

In some embodiments, a positive LKFS value (e.g., a value of 16, 17, . . . , 30 for the "dmixloudoffst" field) of the "dmixloudoffst" field indicates that the measured loudness level of the downmix sound output is louder than the expected loudness level of the downmix sound output by the magnitude of the indicated LKFS value. A negative LKFS value (e.g., a value of 0, 1, . . . , 15 for the "dmixloudoffst" field) of the "dmixloudoffst" field indicates that the measured loudness level of the downmix sound output is quieter or no louder than the expected downmix loudness by the magnitude of the indicated LKFS value.

Some or all of the downmix loudness parameters may be (e.g., additionally, optionally, alternatively, etc.) used by an audio decoder (e.g., 100, etc.) with a speaker configuration such as the specific speaker configuration, etc., to control one or more audio processing operations, algorithms, etc., that operate on the audio content (152) in the encoded audio signal (102) in order to compensate for loudness level differences—of individual portions of the audio content (152) in the encoded audio signal (102)—caused by downmixing the audio content (152) from the reference speaker configuration to the specific speaker configuration.

In some embodiments, an audio decoder (e.g., 100, etc.) described herein is configured to decode (e.g., multi-channel, etc.) audio content from the encoded audio signal (102), extracts a dialog loudness level (e.g., "dialnorm", etc.) from loudness metadata delivered with the audio content, etc. The audio decoder (100) may be operating with a specific speaker configuration (e.g., a two-channel configuration, etc.) that has fewer audio channels than the reference speaker configuration to which the audio content corresponds.

In some embodiments, the audio decoder (100) uses one or more downmix equations to downmix the multi-channel audio content, as received from an encoded audio signal (102) for the reference speaker configuration for which the multi-channel audio content was coded to the specific speaker configuration at the audio decoder, performs one or more audio processing operations, algorithms, etc., on the audio content as downmixed to generate a downmix sound output, etc. The audio decoder (100) may be capable of performing one or more different types of downmixing operations. The audio decoder (100) can be configured to determine and perform a specific type (e.g., LtRt downmixing, LoRo downmixing, etc.) of downmixing operations based on one or more factors. These factors may include, but are not limited only to: one or more of user input that specifies a preference for a specific user-selected type of downmixing operation, user input that specifies a preference for a system-selected type of downmixing operations, capabilities of the specific speaker configuration and/or the audio decoder (100), availability of downmix loudness metadata for the specific type of downmixing operation, any encoder-generated preference flag for a type of downmixing operation, etc. In some embodiments, the audio decoder (100) may implement one or more precedence rules, may solicit further user input, etc., to determine a specific type of downmixing operation if these factors conflict among themselves.

The one or more audio processing operations, algorithms, etc., include, but are not limited only to: a loudness attenuation operation that applies an amount of attenuation (e.g., a difference between a reference loudness level and "dialnorm", etc.) to align/adjust an output dialog loudness level of the downmixed sound output to the reference loudness level based at least in part on the dialog loudness level (e.g., "dialnorm", etc.) and the reference loudness level (e.g., −31 LKFS, etc.). In some embodiments, the audio decoder (100) further performs some or all of gain adjustments due to dialogue normalization, dynamic range compression, fixed attenuation to protect against downmix overload, etc. In some embodiments, these gain adjustments may correspond to—e.g., may be the same or substantially the same as—those performed by the audio encoder (150) in determining the measured loudness level as previously described. One or more of these gain adjustments may be specific to the type (e.g., LtRt downmixing, LoRo downmixing, etc.) of downmixing operation performed by the audio decoder (100).

Additionally, optionally, or alternatively, in some embodiments, the audio decoder (100) is configured to extract downmix loudness metadata (e.g., the "dmixloudoffste" field, the "dmixloudoffst" field, etc.), as a part of metadata delivered with the audio content, from the encoded audio signal (102). In some embodiments, downmix loudness parameters in the extracted downmix loudness metadata comprise one or more different sets of downmix loudness parameters for different types of downmixing operations as indicated to be present by one or more flags carried in the downmix loudness metadata. In response to determining that the one or more sets of downmix loudness parameters are present, the audio decoder (100) can determine/select a set of downmix loudness parameters, among the one or more different sets of downmix loudness parameters, that corresponds to the specific type (e.g., LtRt downmixing, LoRo downmixing, etc.) of downmixing operation performed by the audio decoder (100). The audio decoder (100) determine (e.g., based on whether the "dmixloudoffste" field has a value of 1 or 0, etc.) whether there exists downmix loudness offset data in the specific set of downmix loudness parameters. In response to determining (e.g., based on that the "dmixloudoffste" field has a value of 1, etc.) that there exists downmix loudness offset data in the specific set of downmix loudness parameters, the audio decoder (100) performs a loudness adjustment operation based on downmix loudness offsets in the downmix loudness metadata (e.g., the "dmixloudoffst" field in the same set of downmix loudness parameters, etc.) extracted with the audio content from the encoded audio signal (102). The downmix loudness metadata may comprise the "dmixloudoffst" field having one or more instances for one or more different types of downmixes after applying one or more different sets of gain adjustments, etc. Based on the actual downmixing operation and the actual set (e.g., no gain adjustments, gain adjustments excluding those relating to DRC, gain adjustments including those relating to DRC, gain adjustments excluding those relating to dialog normalization, gain adjustments including those relating to dialog normalization, gain adjustments including those relating to both dialog normalization and DRC, etc.) of gain adjustments performed by the audio decoder (100), the audio decoder (100) can determine/select a specific instance of the one or more instances of the "dmixloudoffst" field in the downmix loudness metadata.

In response to determining that the "dmixloudoffst" field indicates a positive LKFS value (e.g., a value of 16, 17, . . . , 30 for the "dmixloudoffst" field), which means that the loudness level (as measured by an upstream audio encoder such as 150, etc.) of the downmix sound output after applying some or all of gain adjustments due to dialogue normalization, dynamic range compression, fixed attenuation to protect against downmix overload, etc., is louder than the expected loudness level of the downmix sound output by the magnitude of the indicated LKFS value, the audio decoder (100) performs a further gain adjustment with a negative gain value having the magnitude of the indicated LKFS value, which lowers or adjust the loudness level of the downmix sound output to the expected loudness (e.g., the reference loudness level, etc.).

In response to determining that the "dmixloudoffst" field indicates a negative LKFS value (e.g., a value of 1, 2, . . . , 15 for the "dmixloudoffst" field), which means that the (as measured by an upstream audio encoder such as 150, etc.) loudness level of the downmix sound output after applying some or all of gain adjustments due to dialogue normalization, dynamic range compression, fixed attenuation to protect against downmix overload, etc., is quieter or no louder than the expected loudness level of the downmix sound output by the magnitude of the indicated LKFS value, the audio decoder (100) performs a further gain adjustment with a negative gain value having the magnitude of the indicated LKFS value, which increases or adjust the loudness level of the downmix sound output to the expected loudness (e.g., the reference loudness level, etc.).

A negative LKFS value (e.g., a value of 0, 1, . . . , 15 for the "dmixloudoffst" field) of the "dmixloudoffst" field indicates that the measured loudness level of the downmix sound output is quieter or no louder than the expected downmix loudness by the magnitude of the indicated LKFS value. In some embodiments, if a negative LKFS value is indicated/signaled in the encoded audio signal (102) to a recipient decoder, the recipient decoder (e.g., 150, etc.) can take actions to ensure that any positive gain applied to the 2-channel downmix sound output to compensate for the negative LKFS value does not introduce clipping of loudness levels in the 2-channel downmix sound output.

The further gain adjustment based on the loudness offset indicated in the downmix loudness metadata may, but is not limited only to, be specific to the type of downmixing operation performed by the audio decoder (100).

11. Additional Operations Related to Gains

Under techniques as described herein, other processing such as dynamic equalization, noise compensation, etc., can also be performed in the loudness (e.g., perceptual) domain, rather than in the physical domain (or a digital domain representing the physical domain).

In some embodiments, gains from some or all of a variety of processing such as DRC, equalization noise compensation, clip prevention, gain smoothing, etc., may be combined in the same gains in the loudness domain and/or may be applied in parallel. In some other embodiments, gains from some or all of a variety of processing such as DRC, equalization noise compensation, clip prevention, gain smoothing, etc., may be in separate gains in the loudness domain and/or may be applied in series at least in part. In some other embodiments, gains from some or all of a variety of processing such as DRC, equalization noise compensation, clip prevention, gain smoothing, etc., may be applied in order.

12. Specific and Broadband (or Wideband) Loudness Levels

One or more audio processing elements, units, components, etc., such as transmission filters, auditory filterbank, synthesis filterbank, short-time-Fourier transform, etc., may be used by an encoder or decoder to perform audio processing operations as described herein.

In some embodiments, one or more transmission filters that model the outer and middle ear filtering of the human auditory system may be used to filter an incoming audio signal (e.g., an encoded audio signal 102, audio content from a content provider, etc.). In some embodiments, an auditory filterbank may be used to model the frequency selectivity and frequency spread of the human auditory system. Excitation signal levels from some or all of these filters may be determined/calculated and smoothed with frequency dependent time constants that are shorter towards higher frequencies to model the integration of energy in the human auditory system. Subsequently, a non-linear function (e.g., relation, curve, etc.) between excitation signals and specific loudness levels may be used to obtain a profile of frequency-dependent specific loudness levels. A broadband (or wideband) loudness level can be obtained by integrating the specific loudness over frequency bands.

A straightforward (e.g., with equal weight to all frequency bands, etc.) summation/integration of specific loudness levels may work well for broadband signals. However, such an approach may underestimate (e.g., perceptual, etc.) loudness levels for narrowband signals. In some embodiments, specific loudness levels in different frequencies or in different frequency bands are given different weights.

In some embodiments, the auditory filterbanks and/or the transmission filters as mentioned above may be replaced by one or more Short-Time Fourier Transforms (STFT). Responses of the transmission filter and auditory filterbank may be applied in a Fast Fourier Transform (FFT) domain. In some embodiments, one or more inverse transmission filters are used, for example, when one or more (e.g., forward, etc.) transmission filters are used in or before the conversion from the physical domain (or in the digital domain representing the physical domain) to the loudness domain. In some embodiments, inverse transmission filters are not used, for example, when the STFT is used in place of auditory filterbanks and/or transmission filters. In some embodiments, auditory filterbank are omitted; instead, one or more quadrature mirror filters (QMF) are used. In these embodiments, the spreading effect of the basilar membrane in the model of the human auditory system may be omitted without significantly affecting the performance of the audio processing operations as described herein.

Under techniques as described herein, different numbers of frequency bands (e.g., 20 frequency bands, 40 perceptual bands, etc.) may be used in various embodiments. Additionally, optionally or alternatively, different bandwidth widths may also be used in various embodiments.

13. Individual Gains for Individual Subsets of Channels

In some embodiments, when a specific speaker configuration is a multi-channel configuration, an overall loudness levels may be obtained by first summing excitation signals of all channels before the conversion from the physical domain (or in the digital domain representing the physical domain) to the loudness domain. However, applying the same gains to all channels in the specific speaker configuration may not preserve spatial balance among the different channels (e.g., in terms of relative loudness levels between different channels, etc.) of the specific speaker configuration.

In some embodiments, to preserve the spatial balance such that relative perceptual loudness levels among different channels may be optimally or correctly maintained, respective loudness levels and corresponding gains obtained based on the respective loudness levels may be determined or calculated per channel. In some embodiments, the corresponding gains obtained based on the respective loudness levels do not equal the same overall gain; for example, each of some or all of the corresponding gains may equals to the overall gain plus a (e.g., channel-specific) small correction.

In some embodiments, to preserve the spatial balance, respective loudness levels and corresponding gains obtained based on the respective loudness levels may be determined or calculated per subset of channels. In some embodiments, the corresponding gains obtained based on the respective loudness levels do not equal the same overall gain; for example, each of some or all of the corresponding gains may equals to the overall gain plus a (e.g., channel-specific) small correction. In some embodiments, a subset of channels may comprise two or more channels (e.g., a subset of channels comprising left front, right front, and low frequency effect (LFE); a subset of channels comprising left surround and right surround; etc.) forming a proper subset of all channels in the specific speaker configuration. Audio content for the subset of channels may constitute a submix of an overall mix carried in the encoded audio signal (102). The channels within a submix can be applied with the same gains.

In some embodiments, to produce actual loudness (e.g., actually perceived, etc.) from a specific speaker configuration, one or more calibration parameters may be used to relate signal levels in a digital domain to the corresponding physical (e.g., spatial pressure in terms of $dB_{SPL}$, etc.) levels in a physical domain represented by the digital domain. The one or more calibration parameters may be given values that are specific to physical sound equipment in the specific speaker configuration.

14. Auditory Scene Analysis

In some embodiments, an encoder as described herein may implement computer-based auditory scene analysis (ASA) to detect auditory event boundaries in audio content (e.g., encoded into the encoded audio signal 102, etc.), generate one or more ASA parameters format the one or more ASA parameters as a part of an encoded audio signal (e.g., 102, etc.) to be delivered to downstream devices (e.g., decoder 100, etc.). The ASA parameters may include but are not limited only to: any of parameters indicating locations of the auditory event boundaries, values of an auditory event certainty measure (as will be further explained below), etc.

In some embodiments, a (e.g., time-wise) location of an auditory event boundary may be indicated in metadata encoded within the encoded audio signal (102). Additionally, optionally, or alternatively, a (e.g., time-wise) location of an auditory event boundary may be indicated (e.g., with a flag, a data field, etc.) in an audio data block and/or frame at which the location of the auditory event boundary is detected.

As used herein, an auditory event boundary refers to a point at which a preceding auditory event ends and/or a succeeding auditory event begins. Each auditory event occurs between two consecutive auditory event boundaries.

In some embodiments, the encoder (150) is configured to detect auditory event boundaries by differences in specific loudness spectra between two (e.g., time-wise, etc.) consecutive audio data frames. Each of the specific loudness spectra may comprise a spectrum of unsmoothed loudness computed from a corresponding audio data frame of the consecutive audio data frames.

In some embodiments, a specific loudness spectrum $N[b, t]$ may be normalized to obtain a normalized specific loudness spectrum $N_{NORM}[b, t]$ as shown in the following expression:

$$N_{NORM}[b, t] = \frac{N[b, t]}{\max_b \{N[b, t]\}} \quad (1)$$

where b indicates a band, t indicates a time or an audio data frame index, and $$\max_b\{N[b, t]\}$$

is the maximum specific loudness level across all frequency bands.

Normalized specific loudness spectra may be subtracted from each other and used to derive summed absolute differences, D[t], as shown in the following expression:

$$D[t]=\Sigma_b|N_{NORM}[b,t]-N_{NORM}[b,t-1]| \quad (2)$$

The summed absolute differences are mapped to an auditory event certainty measure A[t] with a value range of 0 to 1 as follows:

$$A[t] = \begin{cases} 0 & D[t] \le D_{min} \\ \dfrac{D[t] - D_{min}}{D_{max} - D_{min}} & D_{min} < D[t] < D_{max} \\ 1 & D[t] \ge D_{max} \end{cases} \quad (3)$$

where $D_{min}$, and $D_{max}$, are minimum and maximum thresholds (e.g., user configurable, system configurable, set in relation to past value distribution of D[t] in the audio content, etc.).

In some embodiments, the encoder (150) is configured to detect an auditory event boundary (e.g., a specific t, etc.) when D[t] (e.g., at the specific t, etc.) rises above $D_{min}$.

In some embodiments, a decoder (e.g., 100, etc.) as described herein extracts the ASA parameters from an encoded audio signal (e.g., 102, etc.) and use the ASA parameters to prevent unintentional boosting of soft sounds and/or unintentional cutting of loud sounds that cause perceptual distortions of auditory events.

The decoder (100) may be configured to reduce or prevent unintentional distortions of auditory events by ensuring that within an auditory event the gain is more nearly constant and by confining much of the gain change to the neighborhood of an auditory event boundary. For example, the decoder (100) may be configured to use a relatively small time constant (e.g., comparable with or shorter than a minimum duration of auditory events, etc.) in response to a gain change in an attack (e.g., loudness level increasing, etc.) at an auditory event boundary. Accordingly, the gain change in the attack can be implemented by the decoder (100) relatively rapidly. On the other hand, the decoder (100) may be configured to use a relatively long time constant relative to a duration of an auditory event in response to a gain change in a release (e.g., loudness level decreasing, etc.) in an auditory event. Accordingly, the gain change in the release can be implemented by the decoder (100) relatively slowly so that sounds that ought to appear constant or to decay gradually may not be audibly or perceptually disturbed. The quick response in an attack at an auditory event boundary and the slow response in a release in an auditory event allow a fast perception of an arrival of the auditory event and preserve perceptual qualities and/or integrity during the auditory event—which comprises loud and soft sounds linked by specific loudness level relationships and/or specific time relationships—such as a piano chord, etc.

In some embodiments, auditory events and auditory event boundaries indicated by the ASA parameters are used by the decoder (100) to control gain changes in one, two, some or all of the channels in a specific speaker configuration at the decoder (100).

15. Loudness Level Transitions

Loudness level transitions may occur, for example, between two programs, between a program and a loud commercial, etc. In some embodiments, decoder (100) is configured to maintain a histogram of instantaneous loudness levels based on past audio content (e.g., received from the encoded audio signal 102, for the past 4 seconds, etc.). Over a time interval from before a loudness level transition to after the loudness level transition, two areas with heightened probabilities may be recorded in the histogram. One of the areas centers around a previous loudness level, whereas the other the areas centers around a new loudness level.

The decoder (100) may dynamically determine a smoothed loudness level as the audio content is being processed, and determine a corresponding bin (e.g., a bin of instantaneous loudness levels that include the same value as the smoothed loudness level, etc.) of the histogram based on the smoothed loudness level. The decoder (100) is further configured to compare a probability at the corresponding bin with a threshold (e.g., 6%, 7%, 7.5%, etc.), where the total area (e.g. the sum of all bins) of the histogram curve represents a probability of 100%. The decoder can be configured to detect the occurrence of the loudness level transition by determining that the probability at the corresponding bin falls below the threshold. In response, the decoder (100) may be configured to select a relatively small time constant to adapt relatively fast to the new loudness level. Consequently, time durations of loud (or soft) onsets within loudness level transitions can be reduced.

In some embodiments, the decoder (100) uses a silence/noise gate to prevent low instantaneous loudness levels from entering into the histogram and becoming a high probability bin in the histogram. Additionally, optionally or alternatively, the decoder (100) may be configured to use the ASA parameters to detect auditory events to be included in the histogram. In some embodiments, the decoder (100) may determine time-dependent values of a time-averaged auditory event certainty measure $\overline{A}[t]$ from the ASA parameters. In some embodiments, the decoder (100) may determine time-dependent values of an (e.g., instantaneous, etc.) auditory event certainty measure A[t] from the ASA parameters and compute values of a time-averaged auditory event certainty measure $\overline{A}[t]$ based on the time-dependent values of an (e.g., instantaneous, etc.) auditory event certainty measure A[t] from the ASA parameters, etc. The decoder (100) may be configured to exclude loudness levels from entering the histogram if the time-averaged auditory event certainty measure $\overline{A}[t]$ contemporaneous with the loudness levels fall below a histogram inclusion threshold value (e.g., 0.1, 0.12, etc.).

In some embodiments, for (e.g., instantaneous, etc.) loudness levels (e.g., corresponding $\overline{A}[t]$ values are above the histogram inclusion threshold value, etc.) permitted to be included in the histogram, the loudness levels are assigned weights that are the same as, proportional to, etc., time dependent values of the time-averaged auditory event certainty measure $\overline{A}[t]$ contemporaneous with the loudness levels. As a result, loudness levels near an auditory event boundary have more influence on the histogram (e.g., $\overline{A}[t]$ has relatively large values, etc.) than other loudness levels that are not near an auditory event boundary.

16. Reset

In some embodiments, an encoder as described herein (e.g., 150, etc.) is configured to detect reset events and include indications of the reset events in an encoded audio signal (e.g., 102, etc.) generated by the encoder (150). In a first example, the encoder (150) detects a reset event in response to determining that there occurs a continuous (e.g., 250 milliseconds, configurable by a system and/or a user, etc.) period of relative silence. In a second example, the encoder (150) detects a reset event in response to determining that there occurs a large instantaneous drop in excitation level across all frequency bands. In a third example the encoder is provided with input (e.g. metadata, user input, system controlled, etc.) where transitions in content (e.g. program start/end, scene change, etc.) occur that require a reset.

In some embodiments, a decoder as described herein (e.g., 100, etc.) implements a reset mechanism that can be used to instantaneously speed up gain smoothing. The reset mechanism is useful and may be invoked when switching between channels or audiovisual inputs occurs.

In some embodiments, the decoder (100) can be configured to determine whether a reset event occurs by determining whether there occurs a continuous (e.g., 250 milliseconds, configurable by a system and/or a user, etc.) period of relative silence, whether there occurs a large instantaneous drop in excitation level across all frequency bands, etc.

In some embodiments, the decoder (100) can be configured to determine that a reset event occurs in response to receiving an indication (e.g., of the reset event, etc.) that was provided in an encoded audio signal (102) by an upstream encoder (e.g., 150, etc.).

The reset mechanism may be caused to issue a reset when the decoder (100) determining that a reset event occurs. In some embodiments, the reset mechanism is configured to use a slightly more aggressive cut behavior of the DRC compression curve to prevent hard onsets (e.g., of a loud program/channel/audiovisual source, etc.). Additionally, optionally, or alternatively, the decoder (100) may be configured to implement safeguards to recover gracefully when the decoder (100) detects that a reset is falsely triggered.

17. Encoder-Provided Gains

In some embodiments, the audio encoder can be configured to compute one or more sets of gains (e.g., DRC gains, etc.) for individual portions (e.g., audio data blocks, audio data frames, etc.) of the audio content to be encoded into the encoded audio signal. The sets of gains generated by the audio encoder may comprise one or more of: a first set of gains comprising a single broadband (or wideband) gain for all channels (e.g., left front, right front, low frequency effect or LFE, center, left surround, right surround, etc.); a second set of gains comprising individual broadband (or wideband) gains for individual subsets of channels; a third set of gains comprising individual broadband (or wideband) gains for individual subsets of channels and for each of a first number (e.g., two, etc.) of individual bands (e.g., two bands in each channel, etc.); a fourth set of gains comprising individual broadband (or wideband) gains for individual subsets of channels and for each of a second number (e.g., four, etc.) of individual bands (e.g., four bands in each channel, etc.); etc. A subset of channels as described herein may be one of a subset comprising left front, right front and LFE channels, a subset comprising a center channel, a subset comprising left surround and right surround channels, etc.

Figure 4:
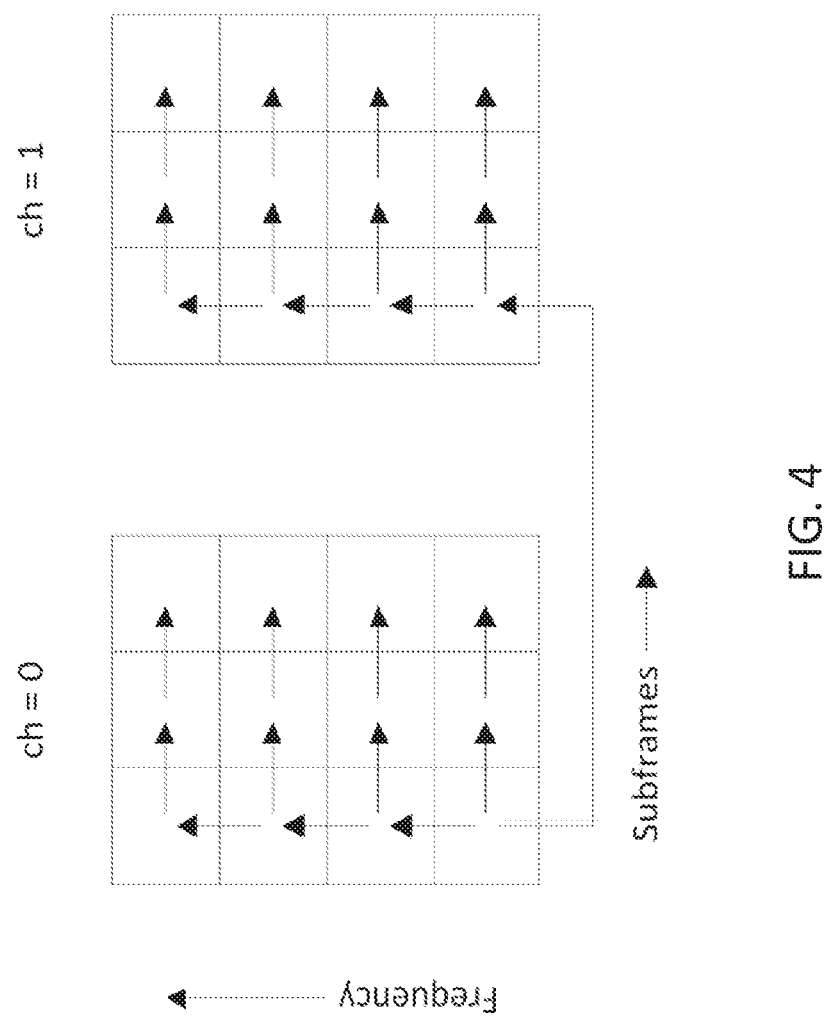
FIG. 4 illustrates example differential coding of gains.

In some embodiments, the audio encoder is configured to transmit one or more portions (e.g., audio data blocks, audio data frames, etc.) of the audio content and one or more sets of gains computed for the one or more portions of the audio content in a time-synchronous manner. An audio decoder that receives the one or more portions of the audio content can select and apply a set of gains among the one or more sets of gains with little or no delay. In some embodiments, the audio encoder can implement sub-framing techniques under which the one or more sets of gains are carried (e.g., with differential coding, etc.) in one or more sub-frames as illustrated in FIG. 4. In an example, the sub-frames may be encoded within the audio data blocks or audio data frames for which the gains are computed. In another example, the sub-frames may be encoded within audio data blocks or audio data frames preceding the audio data blocks or audio data frames for which the gains are computed. In another non-limiting example, the sub-frames may be encoded within audio data blocks or audio data frames within a certain time from the audio data blocks or audio data frames for which the gains are computed. In some embodiments, Huffman and differential coding may be used to populate and/or compress the sub-frames that carry the sets of gains.

18. Example System and Process Flows

Figure 5:
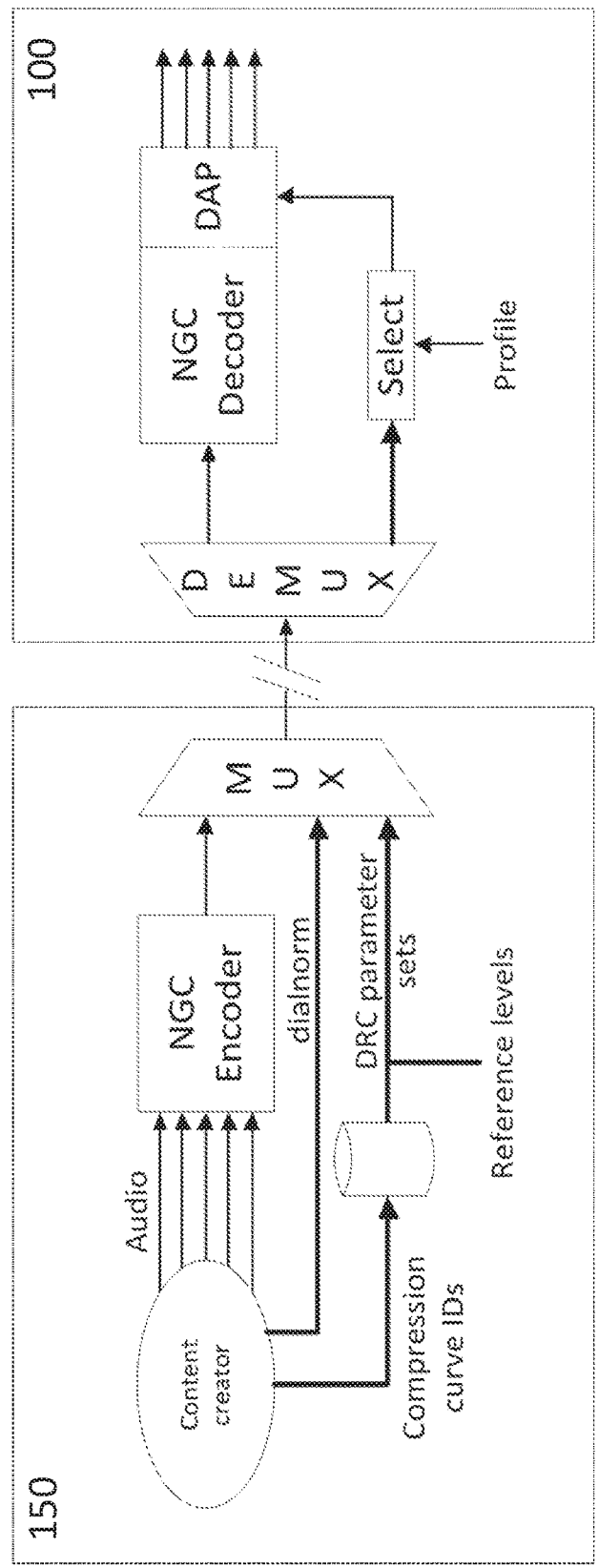
FIG. 5 illustrates an example codec system comprising an audio encoder and an audio decoder.

FIG. 5 illustrates an example codec system in a non-limiting example embodiment. A content creator, which may be a processing unit in an audio encoder such as 150, etc., is configured to provide audio content ("Audio") to an encoder unit ("NGC Encoder"). The encoder unit formats the audio content into audio data blocks and/or frames and encodes the audio data blocks and/or frames into an encoded audio signal. The content creator is also configured to establish/generate one or more dialog loudness levels ("dialnorm") of one or more programs, commercials, etc., in the audio content and one or more dynamic range compression curve identifiers ("Compression curve IDs"). The content creator may determine the dialog loudness levels from one or more dialogue audio tracks in the audio content. The dynamic range compression curve identifiers may be selected based at least in part on user input, system configuration parameters, etc. The content creator may be a person (e.g. artist, audio engineer, etc.) using tools to generate the audio content and dialnorm.

Based on the dynamic range compression curve identifiers, the encoder (150) generates one or more DRC parameter sets including but not limited to corresponding reference dialogue loudness levels ("Reference levels") for a plurality of playback environments supported by the one or more dynamic range compression curves. These DRC parameter sets may be encoded in-band with the audio content, out-of-band with the audio content, etc., in metadata of the encoded audio signal. Operations such as compression, formatting multiplexing ("MUX"), etc., may be performed as a part of generating the encoded audio signal that may be delivered to an audio decoder such as 100, etc. An encoded audio signal may be encoded with a syntax that supports carriage of audio data elements, DRC parameter sets, reference loudness levels, dynamic range compression curves, functions, lookup tables, Huffman codes used in compression, sub-frames, etc. In some embodiments, the syntax allows an upstream device (e.g., an encoder, a decoder, a transcoder, etc.) to transmit gains to a downstream device (e.g., a decoder, a transcoder, etc.). In some embodiments, the syntax used to encode data into and/or decode the data from an encoded audio signal is configured to support backward compatibility such that a device that relies on gains computed by an upstream device may optionally continue to do so.

In some embodiments, the encoder (150) computes one, two or more sets of gains (e.g., DRC gains, gain smoothing, with appropriate reference dialogue loudness levels, etc.) for the audio content. The sets for gains may be provided with the one or more dynamic range compression curves in the metadata encoded with the audio content into the encoded audio signal. A first set of gains may correspond to a broadband (or wideband) gain for all channels in a (e.g., default, etc.) speaker configuration or profile. A second set of gains may correspond to a broadband (or wideband) gain for each of the all channels in the speaker configuration or profile. A third set of gains may correspond to a broadband (or wideband) gain for each of two bands in each of the all channels in the speaker configuration or profile. A fourth set of gains may correspond to a broadband (or wideband) gain for each of four bands in each of the all channels in the speaker configuration or profile. In some embodiments, the sets of gains computed for a speaker configuration may be transmitted with a (e.g., parameterized, etc.) dynamic range compression curve for the speaker configuration in the metadata. In some embodiments, the sets of gains computed for a speaker configuration may replace a (e.g., parameterized, etc.) dynamic range compression curve for the speaker configuration in the metadata. Additional speaker configurations or profiles may be supported under techniques as described herein.

The decoder (100) is configured to extract the audio data blocks and/or frames and the metadata from the encoded audio signals, for example, through operations such as decompression, deformatting, demultiplexing ("DEMUX"), etc. The extracted audio data blocks and/or frames may be decoded by a decoder unit ("NGC Decoder") into audio data elements or samples. The decoder (100) is further configured to determine a profile for a specific playback environment at the decoder (100), in which the audio content is to be rendered, and select a dynamic range compression curve from the metadata extracted from the encoded audio signal. A digital audio processing unit ("DAP") is configured to apply DRC and other operations on the audio data elements or samples for the purpose of generating audio signals that drive audio channels in the specific playback environment. The decoder (100) can calculate and apply DRC gains based on loudness levels determined from audio data blocks or frames and the selected dynamic range compression curve. The decoder (100) can also adjust the output dialogue loudness level based on a reference dialogue loudness level associated with the selected dynamic range compression curve and the dialogue loudness levels in the metadata extracted from the encoded audio signal. The decoder (100) can subsequently apply gain limiter that is specific to a playback scenario as related to the audio content and the specific playback environment. Thus, the decoder (100) can render/play the audio content as tailored to the playback scenario.

FIG. 6A through FIG. 6D illustrate example process flows. In some embodiments, one or more computing devices or units in a media processing system may perform this process flow.

FIG. 6A illustrates an example process flow that may be implemented by an audio decoder as described herein. In block 602 of FIG. 6A, a first device (e.g., an audio decoder 100 of FIG. 1A, etc.) receives an audio signal that comprises audio content and definition data for one or more dynamic range compression curves.

In block 604, the first device determines a specific playback environment.

In block 606, the first device establishes a specific dynamic range compression curve for the specific playback environment based on the definition data for the one or more dynamic range compression curves extracted from the audio signal.

In block 608, the first device performs one or more dynamic range control (DRC) operations on one or more portions of the audio content extracted from the audio signal. The one or more DRC operations being based at least in part on one or more DRC gains obtained from the specific dynamic range compression curve.

In an embodiment, the definition data for the one or more dynamic range compression curves comprises one or more of attack times, release times, or reference loudness levels related to at least one of the one or more dynamic range compression curves.

In an embodiment, the first device is further configured to perform: computing one or more loudness levels for the one or more portions of the audio content; determining the one or more DRC gains based on the specific dynamic range compression curve and the one or more loudness levels for the one or more portions of the audio content; etc.

In an embodiment, at least one of the loudness levels computed for the one or more portions of the audio content is one or more of specific loudness levels relating to one or more frequency bands, broadband loudness levels across a broadband range, wideband loudness levels across a wideband range, broadband loudness levels across a plurality of frequency bands, wideband loudness levels across a plurality of frequency bands, etc.

In an embodiment, at least one of the loudness levels computed for the one or more portions of the audio content is one or more of instantaneous loudness levels or loudness levels smoothed over one or more time intervals.

In an embodiment, the one or more operations comprise one or more operations related to one or more of adjusting dialog loudness levels, gain smoothing, gain limiting, dynamic equalization, noise compensation, etc.

In an embodiment, the first device is further configured to perform: extracting one or more dialogue loudness levels from the encoded audio signal; adjusting the one or more dialogue loudness levels to one or more reference dialogue loudness levels; etc.

In an embodiment, the first device is further configured to perform: extracting one or more auditory scene analysis (ASA) parameters from the encoded audio signal; changing one or more time constants used in smoothing gains applied to the audio content, the gains relating to one or more of the one or more DRC gains, gain smoothing, or gain limiting; etc.

In an embodiment, the first device is further configured to perform: determining that a reset event occurs in the one or more portions of the audio content based on an indication of a reset event, the indication of the reset being extracted from the encoded audio signal; in response to determining that the reset event occurs in the one or more portions of the audio content, taking one or more actions on one or more gain smoothing operations being performed at a time of determining that the reset event occurs in the one or more portions of the audio content; etc.

In an embodiment, the first device is further configured to perform: maintaining a histogram of instantaneous loudness levels, the histogram being populated by instantaneous loudness levels computed from a time interval in the audio content; determining whether a specific loudness level is above a threshold in a high probability area of the histogram, the specific loudness level being computed from a portion of the audio content; in response to determining that the specific loudness level is above the threshold in the high probability area of the histogram, performing: determining that a loudness transition occurs, shortening a time constant used in gain smoothing to speed up the loudness transition, etc.; etc.

Figure 6B:
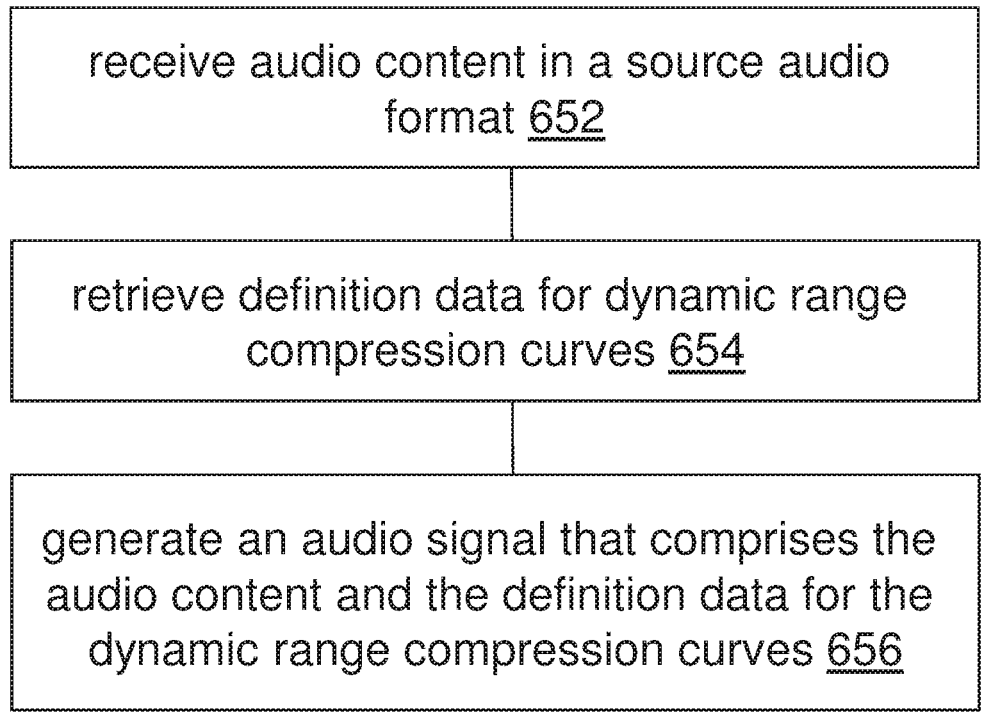

FIG. 6B illustrates an example process flow that may be implemented by an audio encoder as described herein. In block 652 of FIG. 6B, a second device (e.g., an audio encoder 150 of FIG. 1B, etc.) receives audio content in a source audio format.

In block 654, the second device retrieves definition data for one or more dynamic range compression curves.

In block 656, the second device generates an audio signal that comprises the audio content and the definition data for the one or more dynamic range compression curves.

In an embodiment, the second device is further configured to perform: determining one or more identifiers for the one or more dynamic range compression curves; retrieving the definition data for the one or more dynamic range compression curves from a reference data repository based on the one or more identifiers; etc.

In an embodiment, the second device is further configured to perform: computing one or more dialogue loudness levels for the one or more portions of the audio content; encoding the one or more dialogue loudness levels with the one or more portions of the audio content into the encoded audio signal; etc.

In an embodiment, the second device is further configured to perform: performing auditory event scene (ASA) on the one or more portions of the audio content; generating one or more ASA parameters based on results of the ASA on the one or more portions of the audio content; encoding the one or more ASA parameters with the one or more portions of the audio content into the encoded audio signal; etc.

In an embodiment, the second device is further configured to perform: determining that one or more reset events occur in the one or more portions of the audio content; encoding one or more indications of the one or more reset events with the one or more portions of the audio content into the encoded audio signal; etc.

In an embodiment, the second device is further configured to encode the one or more portions of the audio content into one or more of audio data frames or audio data blocks.

In an embodiment, a first DRC gain of the one or more DRC gains applies to each channel in a first proper subset in a set of all channels in a specific speaker configuration that corresponds to the specific playback environment, whereas a second different DRC gain of the one or more DRC gains applies to each channel in a second proper subset in the set of all channels in the specific speaker configuration that corresponds to the specific playback environment.

In an embodiment, a first DRC gain of the one or more DRC gains applies to a first frequency band, whereas a second different DRC gain of the one or more DRC gains applies to a second different frequency band.

In an embodiment, the one or more portions of the audio content comprise one or more of audio data frames or audio data blocks. In an embodiment, the encoded audio signal is a part of an audiovisual signal.

In an embodiment, the one or more DRC gains are defined in a loudness domain.

Figure 6C:
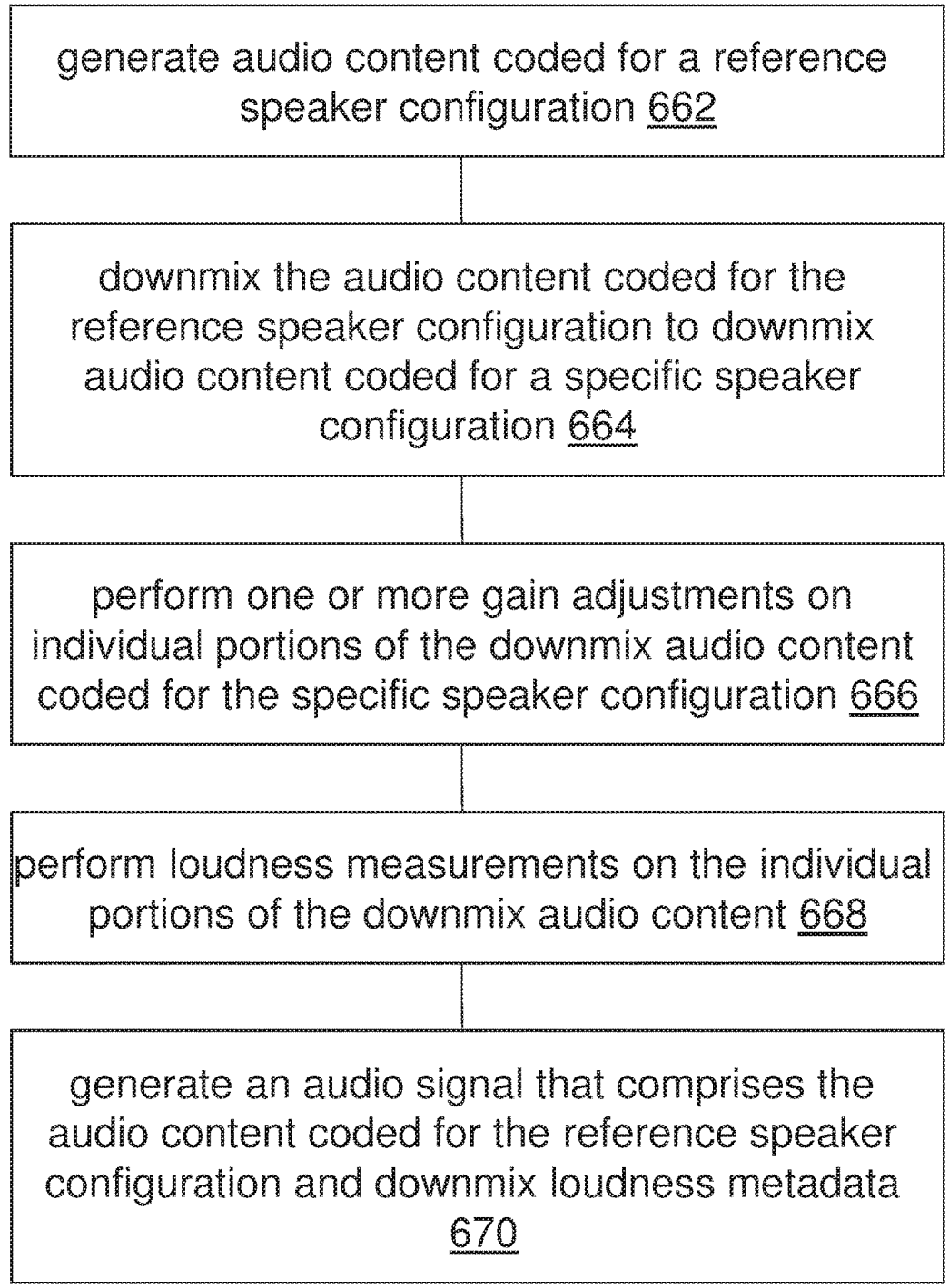

FIG. 6C illustrates an example process flow that may be implemented by an audio encoder as described herein. In block 662 of FIG. 6C, a third device (e.g., an audio encoder 150 of FIG. 1B, etc.) generates audio content coded for a reference speaker configuration.

In block 664, the second device downmixes the audio content coded for the reference speaker configuration to downmix audio content coded for a specific speaker configuration.

In block 666, the second device performs one or more gain adjustments on individual portions of the downmix audio content coded for the specific speaker configuration.

In block 668, the second device performs loudness measurements on the individual portions of the downmix audio content.

In block 670, the second device generates an audio signal that comprises the audio content coded for the reference speaker configuration and downmix loudness metadata created based at least in part on the loudness measurements on the individual portions of the downmix audio content;

In an embodiment, the loudness measurements on the individual portions of the downmix audio content are performed after the one or more gain adjustments are applied to the individual portions of the downmix audio content. In some embodiments, the loudness measurements are based on a Loudness-K-weighted-Full-Scale (LKFS) standard. In some other embodiments, the loudness measurements are based on a loudness standard other than a Loudness-K-weighted-Full-Scale (LKFS) standard.

In an embodiment, the audio content coded for the reference speaker configuration is downmixed to the downmix audio content coded for the specific speaker configuration based on one or more types of downmixing operations; the loudness measurements on the individual portions of the downmix audio content include loudness measurements on the individual portions of the downmix audio content relating to each of the one or more types of downmixing operations.

In an embodiment, the third device is further configured to prevent the downmixed audio content for the specific speaker configuration from being encoded in the audio signal.

Figure 6D:
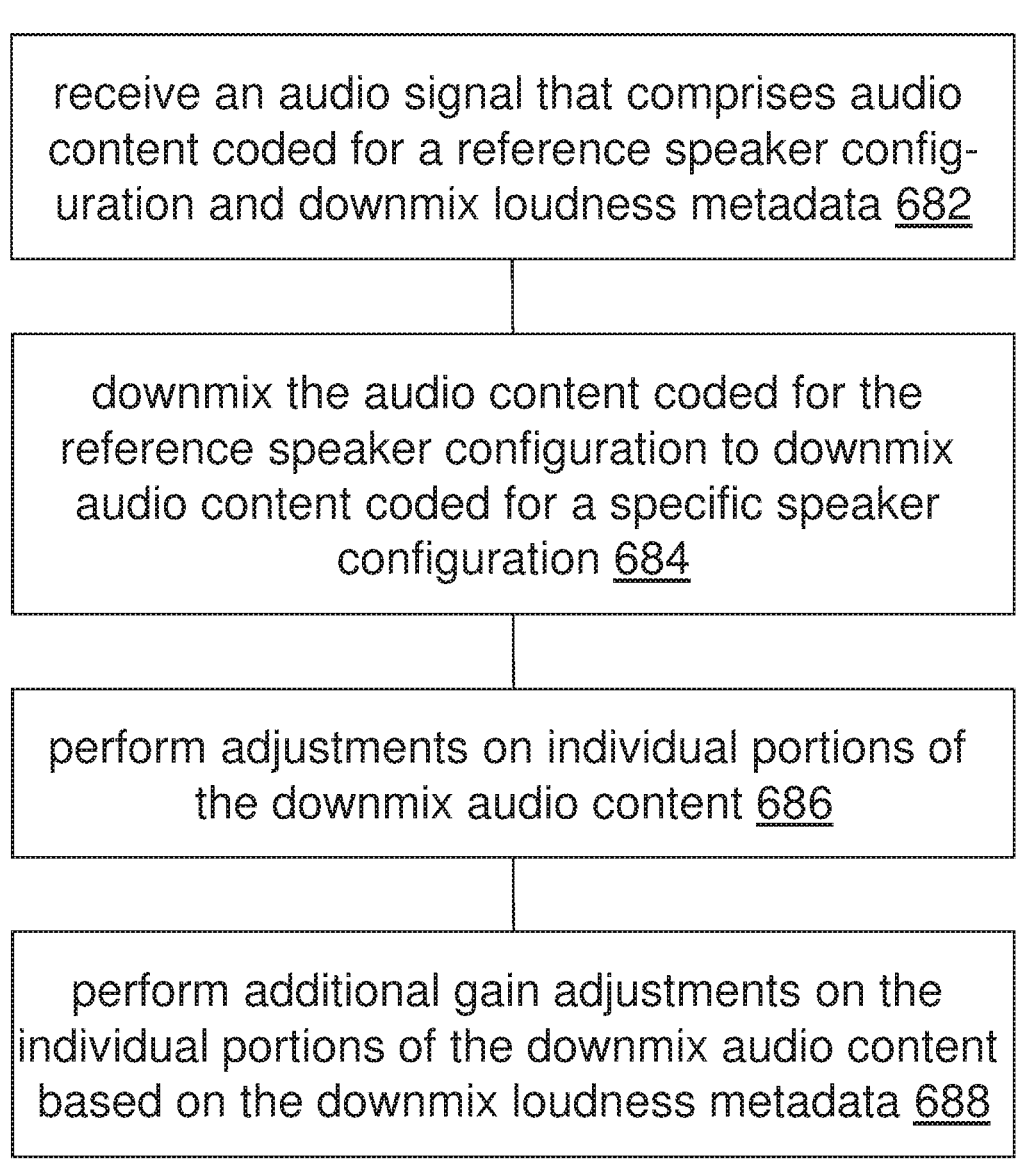

FIG. 6D illustrates an example process flow that may be implemented by an audio decoder as described herein. In block 682 of FIG. 6D, a fourth device (e.g., an audio decoder 100 of FIG. 1A, etc.) operating with a specific speaker configuration receives an audio signal that comprises audio content coded for a reference speaker configuration and downmix loudness metadata.

In block 684, the first device downmixes the audio content coded for the reference speaker configuration to downmix audio content coded for the specific speaker configuration.

In block 686, the first device performs one or more gain adjustments on individual portions of the downmix audio content coded for the specific speaker configuration. The one or more gain adjustments are not based on the downmix loudness metadata; and correspond to one or more gain adjustments performed by an upstream audio encoder, before generating the downmix loudness metadata by the upstream audio encoder.

In block 688 the first device performs one or more additional gain adjustments on the individual portions of the downmix audio content coded for the specific speaker configuration, the one or more additional gain adjustment being based on the downmix loudness metadata.

In an embodiment, the first device is further configured to perform: determining a specific type of downmixing operation based on one or more selection factors; applying the specific type of downmixing operation in downmixing the audio content coded for the reference speaker configuration to the downmix audio content coded for the specific speaker configuration; determining, from one or more sets of downmixing loudness parameters in the downmix loudness metadata, a specific set of downmix loudness parameters to which the specific type of downmixing operation correspond; and performing the one or more additional gain adjustments on the individual portions of the downmix audio content coded for the specific speaker configuration based at least in part on the specific set of downmix loudness parameters.

In an embodiment, the one or more gain adjustments do not produce an expected loudness in a downmix sound output for at least one individual portion of the one or more individual portions of the downmix audio content, wherein the one or more additional gain adjustments are performed to produce an expected loudness in a downmix sound output for the at least one individual portion of the one or more individual portions of the downmix audio content.

In an embodiment, the reference speaker configuration is a surround speaker configuration, and wherein the specific speaker configuration is a two-channel configuration.

In an embodiment, the audio content coded for the reference speaker configuration is downmixed to the downmix audio content coded for the specific speaker configuration based on one or more downmix equations.

In an embodiment, the downmix loudness metadata comprises one or more sets of downmix loudness parameters, each set of the two or more sets of downmix loudness parameters corresponding to an individual type of downmixing operation among one or more types of downmix operations to which the one or more sets of downmix loudness parameters correspond.

In an embodiment, the one or more types of downmixing operations comprise at least one of LtRt dowmixing operation or LoRo downmixing operation.

In an embodiment, the one or more gain adjustments comprise at least one gain adjustment relating to one or more of dialogue normalization, dynamic range compression, or fixed attenuation to protect against downmix overload.

In an embodiment, the one or more gain adjustments use different gain adjustment parameter values for at least two different portions of the individual portions of the audio content.

In an embodiment, the downmix loudness metadata represents a part of overall audio metadata encoded in the audio signal. In an embodiment, the downmix loudness metadata comprises a data field to indicate a downmix loudness offset. In an embodiment, the encoded audio signal is a part of an audiovisual signal.

In an embodiment, an apparatus comprising a processor and configured to perform any one of the methods as described herein.

In an embodiment, a non-transitory computer readable storage medium, comprising software instructions, which when executed by one or more processors cause performance of any one of the methods as described herein. Note that, although separate embodiments are discussed herein, any combination of embodiments and/or partial embodiments discussed herein may be combined to form further embodiments.

19. Implementation Mechanisms—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 7:
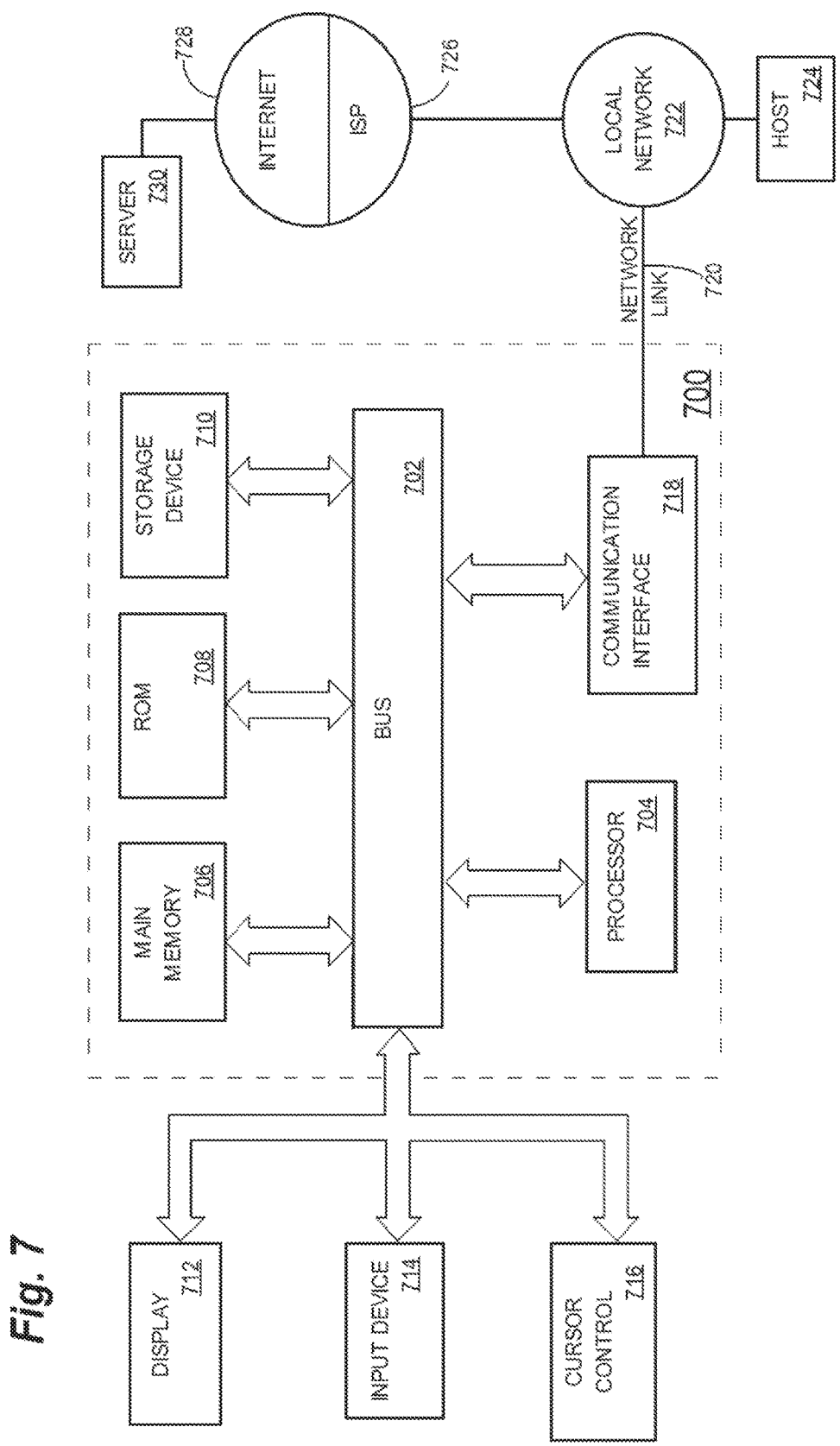
FIG. 7 illustrates an example hardware platform on which a computer or a computing device as described herein may be implemented.

For example, FIG. 7 is a block diagram that illustrates a computer system 700 upon which an embodiment of the invention may be implemented. Computer system 700 includes a bus 702 or other communication mechanism for communicating information, and a hardware processor 704 coupled with bus 702 for processing information. Hardware processor 704 may be, for example, a general purpose microprocessor.

Computer system 700 also includes a main memory 706, such as a random access memory (RAM) or other dynamic storage device, coupled to bus 702 for storing information and instructions to be executed by processor 704. Main memory 706 also may be used for storing temporary variables or other intermediate information during execution of instructions to be executed by processor 704. Such instructions, when stored in non-transitory storage media accessible to processor 704, render computer system 700 into a special-purpose machine that is device-specific to perform the operations specified in the instructions.

Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a liquid crystal display (LCD), for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

Computer system 700 may implement the techniques described herein using device-specific hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor 704 executing one or more sequences of one or more instructions contained in main memory 706. Such instructions may be read into main memory 706 from another storage medium, such as storage device 710. Execution of the sequences of instructions contained in main memory 706 causes processor 704 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 710. Volatile media includes dynamic memory, such as main memory 706. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 702. Transmission media can also take the form of acoustic or light waves, such as those generated during radio-wave and infra-red data communications.

Various forms of media may be involved in carrying one or more sequences of one or more instructions to processor 704 for execution. For example, the instructions may initially be carried on a magnetic disk or solid state drive of a remote computer. The remote computer can load the instructions into its dynamic memory and send the instructions over a telephone line using a modem. A modem local to computer system 700 can receive the data on the telephone line and use an infra-red transmitter to convert the data to an infra-red signal. An infra-red detector can receive the data carried in the infra-red signal and appropriate circuitry can place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be an integrated services digital network (ISDN) card, cable modem, satellite modem, or a modem to provide a data communication connection to a corresponding type of telephone line. As another example, communication interface 718 may be a local area network (LAN) card to provide a data communication connection to a compatible LAN. Wireless links may also be implemented. In any such implementation, communication interface 718 sends and receives electrical, electromagnetic or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the world wide packet data communication network now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are example forms of transmission media.

Computer system 700 can send messages and receive data, including program code, through the network(s), network link 720 and communication interface 718. In the Internet example, a server 730 might transmit a requested code for an application program through Internet 728, ISP 726, local network 722 and communication interface 718.

The received code may be executed by processor 704 as it is received, and/or stored in storage device 710, or other non-volatile storage for later execution.

20. Equivalents, Extensions, Alternatives and Miscellaneous

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, feature, feature, advantage or attribute that is not expressly recited in a claim should limit the scope of such claim in any way. The specification and drawings are, accordingly, to be regarded in an illustrative rather than a restrictive sense.

What is claimed is:

1. A method for gain adjusting audio signals based on encoder-generated loudness metadata, the method comprising:

receiving, by an audio decoder operating in a playback channel configuration different from a reference channel configuration, an audio signal for the reference channel configuration, the audio signal including audio sample data for each channel of the reference channel configuration, and the encoder-generated loudness metadata, the encoder-generated loudness metadata comprising loudness metadata for a plurality of channel configurations including the playback channel configuration and the reference channel configuration;

selecting, from the loudness metadata for the plurality of channel configurations, the loudness metadata for the playback channel configuration;

determining loudness adjustment gains from the loudness metadata for the playback channel configuration; and applying the loudness adjustment gains as a part of overall gains applied to the audio sample data to generate output audio sample data for each channel of the playback channel configuration;

wherein the loudness adjustment gains depend on a loudness level indicated by the loudness metadata for the playback channel configuration and a reference loudness level.

2. A non-transitory computer readable storage medium, storing software instructions, which when executed by one or more processors cause performing:

receiving, by an audio decoder operating in a playback channel configuration different from a reference channel configuration, an audio signal for the reference channel configuration, the audio signal including audio sample data for each channel of the reference channel configuration, and encoder-generated loudness metadata, the encoder-generated loudness metadata comprising loudness metadata for a plurality of channel configurations including the playback channel configuration and the reference channel configuration;

selecting, from the loudness metadata for the plurality of channel configurations, the loudness metadata for the playback channel configuration;

determining loudness adjustment gains from the loudness metadata for the playback channel configuration; and applying the loudness adjustment gains as a part of overall gains applied to the audio sample data to generate output audio sample data for each channel of the playback channel configuration;

wherein the loudness adjustment gains depend on a loudness level indicated by the loudness metadata for the playback channel configuration and a reference loudness level.

3. An audio signal processing device for gain adjusting audio signals based on encoder-generated loudness metadata, wherein the audio signal processing device:

receives, by an audio decoder operating in a playback channel configuration different from a reference channel configuration, an audio signal for the reference channel configuration, the audio signal including audio sample data for each channel of the reference channel configuration, and the encoder-generated loudness metadata, the encoder-generated loudness metadata comprising loudness metadata for a plurality of channel configurations including the playback channel configuration and the reference channel configuration;

selects, from the loudness metadata for the plurality of channel configurations, the loudness metadata for the playback channel configuration;

determines loudness adjustment gains from the loudness metadata for the playback channel configuration; and applies the loudness adjustment gains as a part of overall gains applied to the audio sample data to generate output audio sample data for each channel of the playback channel configuration;

wherein the loudness adjustment gains depend on a loudness level indicated by the loudness metadata for the playback channel configuration and a reference loudness level.

* * * * *